(12) United States Patent
Myers

(10) Patent No.: US 9,697,409 B2
(45) Date of Patent: Jul. 4, 2017

(54) BIOMETRIC SENSOR STACK STRUCTURE

(71) Applicant: Apple Inc., Cupertino, CA (US)

(72) Inventor: Scott A. Myers, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/256,888

(22) Filed: Apr. 18, 2014

(65) Prior Publication Data

US 2015/0071509 A1    Mar. 12, 2015

Related U.S. Application Data

(60) Provisional application No. 61/875,772, filed on Sep. 10, 2013.

(51) Int. Cl.
G06K 9/00 (2006.01)
H01L 23/10 (2006.01)
H01L 23/00 (2006.01)

(52) U.S. Cl.
CPC ....... *G06K 9/0002* (2013.01); *G06K 9/00053* (2013.01); *H01L 23/10* (2013.01); *H01L 23/562* (2013.01); *H01L 2924/0002* (2013.01)

(58) Field of Classification Search
CPC .. G06K 9/00; G06K 9/00006; G06K 9/00013; G06K 9/0004; G06K 9/00053; H01L 23/08; H01L 23/10; H01L 23/562; G06F 21/32; G06F 2203/04106; G06F 2203/04107; H04M 2203/6054
USPC .......................................... 382/124, 115, 126
See application file for complete search history.

(56) References Cited

U.S. PATENT DOCUMENTS

| | | |
|---|---|---|
| 3,876,942 A | 4/1975 | Koster |
| 4,421,418 A | 12/1983 | Morishima |
| 5,650,597 A | 7/1997 | Redmayne |
| 5,731,222 A | 3/1998 | Malloy et al. |
| 5,953,441 A | 9/1999 | Setlak |

(Continued)

FOREIGN PATENT DOCUMENTS

| | | |
|---|---|---|
| AU | 2013100571 | 5/2013 |
| CN | 1164075 | 11/1997 |

(Continued)

OTHER PUBLICATIONS

Author Unknown, "DC-to-DC converter," Wikipedia, the free encyclopedia, Apr. 12, 2012, XP 055092945, retrieved from the internet on Dec. 11, 2013: URL:http://en.wikipedia.org/w/index.php?title=DC-to-DC_converter&oldid=487061873.

(Continued)

*Primary Examiner* — Eric Rush
(74) *Attorney, Agent, or Firm* — Brownstein Hyatt Farber Schreck, LLP

(57) ABSTRACT

Various structures and methods are disclosed for packaging a biometric sensor, such as a capacitive biometric sensor. Embodiments incorporate various placements of the biometric sensor, structure surrounding a biometric sensor, connection structures (electrical, physical, or both), and techniques for enhanced sensor imaging, sensor retention, and guiding a user's finger to a proper location above a biometric sensor. For example, A biometric sensor assembly can include an aperture formed in a trim with a cap disposed in the aperture. A biometric sensor may be positioned below the cap and a switch positioned below the biometric sensor.

16 Claims, 18 Drawing Sheets

(56) References Cited

U.S. PATENT DOCUMENTS

| | | | | |
|---|---|---|---|---|
| 5,963,679 | A | 10/1999 | Setlak | |
| 6,049,620 | A | 4/2000 | Dickinson et al. | |
| 6,067,368 | A * | 5/2000 | Setlak | G06K 9/0002 382/124 |
| 6,088,471 | A | 7/2000 | Setlak et al. | |
| 6,259,804 | B1 | 7/2001 | Setlak et al. | |
| 6,327,376 | B1 * | 12/2001 | Harkin | 382/124 |
| 6,400,359 | B1 | 6/2002 | Katabami | |
| 6,483,931 | B2 | 11/2002 | Kalnitsky et al. | |
| 6,522,773 | B1 | 2/2003 | Houdeau | |
| 6,628,812 | B1 | 9/2003 | Setlak | |
| 6,647,133 | B1 | 11/2003 | Morita | |
| 6,734,655 | B1 | 5/2004 | Javanifard | |
| 6,737,329 | B2 | 5/2004 | Lepert et al. | |
| 6,815,657 | B2 | 11/2004 | Toyoshima et al. | |
| 6,882,338 | B2 | 4/2005 | Flowers | |
| 6,906,529 | B2 | 6/2005 | Blanchard | |
| 6,996,492 | B1 | 2/2006 | Testoni | |
| 7,042,317 | B2 | 5/2006 | Xiao et al. | |
| 7,194,113 | B2 | 3/2007 | Greschitz et al. | |
| 7,202,764 | B2 | 4/2007 | Deligianni et al. | |
| 7,227,213 | B2 | 6/2007 | Mastromatteo et al. | |
| 7,236,765 | B2 | 6/2007 | Bonicatto et al. | |
| 7,251,351 | B2 | 7/2007 | Mathiassen | |
| 7,262,609 | B2 | 8/2007 | Reynolds | |
| 7,290,323 | B2 | 11/2007 | Deconde et al. | |
| 7,318,550 | B2 | 1/2008 | Bonalle et al. | |
| 7,397,096 | B2 | 7/2008 | Chou et al. | |
| 7,403,749 | B2 | 7/2008 | Kuijstermans et al. | |
| 7,460,109 | B2 * | 12/2008 | Safai et al. | 345/173 |
| 7,521,942 | B2 | 4/2009 | Reynolds | |
| 7,536,039 | B2 * | 5/2009 | Shinoda et al. | 382/124 |
| 7,548,636 | B2 | 6/2009 | Shimamura et al. | |
| 7,583,092 | B2 | 9/2009 | Reynolds et al. | |
| 7,627,151 | B2 | 12/2009 | Rowe | |
| 7,683,638 | B2 | 3/2010 | Chuang et al. | |
| 7,696,497 | B2 | 4/2010 | Rogers | |
| 7,705,613 | B2 | 4/2010 | Misra | |
| 7,757,096 | B2 * | 7/2010 | Murata et al. | 713/186 |
| 7,777,501 | B2 | 8/2010 | Reynolds et al. | |
| 7,835,553 | B2 | 11/2010 | Miyasaka | |
| 7,986,153 | B2 | 7/2011 | Easter | |
| 8,031,916 | B2 * | 10/2011 | Abiko et al. | 382/126 |
| 8,041,083 | B2 | 10/2011 | Pai et al. | |
| 8,073,204 | B2 | 12/2011 | Kramer et al. | |
| 8,093,099 | B2 | 1/2012 | Purushothaman et al. | |
| 8,111,136 | B2 | 2/2012 | Wong et al. | |
| 8,116,540 | B2 | 2/2012 | Dean et al. | |
| 8,174,372 | B2 | 5/2012 | da Costa | |
| 8,195,117 | B2 | 6/2012 | Bult et al. | |
| 8,264,463 | B2 | 9/2012 | Takashima et al. | |
| 8,283,934 | B2 | 10/2012 | Nishizono | |
| 8,305,360 | B2 | 11/2012 | Wu | |
| 8,366,633 | B2 | 2/2013 | Wolf | |
| 8,456,330 | B2 | 6/2013 | Filson et al. | |
| 8,461,948 | B2 | 6/2013 | Pulskamp | |
| 8,482,381 | B2 | 7/2013 | Chatterjee et al. | |
| 8,482,546 | B2 | 7/2013 | Chai et al. | |
| 8,598,555 | B2 | 12/2013 | Guerrero | |
| 8,606,227 | B2 | 12/2013 | Karam et al. | |
| 8,716,613 | B2 | 5/2014 | Perezselsky et al. | |
| 8,717,775 | B1 * | 5/2014 | Bologna | G06K 9/00053 361/761 |
| 8,723,062 | B2 | 5/2014 | Chen | |
| 8,724,038 | B2 | 5/2014 | Ganapathi et al. | |
| 8,736,001 | B2 | 5/2014 | Salatino et al. | |
| 8,743,082 | B2 * | 6/2014 | Ganapathi et al. | 345/174 |
| 8,743,083 | B2 | 6/2014 | Zanone et al. | |
| 8,748,842 | B2 | 6/2014 | Ohashi | |
| 8,749,523 | B2 | 6/2014 | Pance et al. | |
| 8,779,540 | B2 | 7/2014 | Kerness et al. | |
| 8,780,071 | B2 | 7/2014 | Chen | |
| 8,841,749 | B2 | 9/2014 | Joblot et al. | |
| 8,860,683 | B2 | 10/2014 | Baumbach | |
| 8,866,347 | B2 | 10/2014 | Benkley, III | |
| 8,907,897 | B2 | 12/2014 | Ferren et al. | |
| 9,035,895 | B2 | 5/2015 | Bussat et al. | |
| 9,065,321 | B2 | 6/2015 | Divan et al. | |
| 9,099,282 | B2 | 8/2015 | Rogers et al. | |
| 9,110,538 | B2 | 8/2015 | Dunko et al. | |
| 9,135,495 | B1 | 9/2015 | Pope et al. | |
| 9,153,490 | B2 | 10/2015 | Mitsuhashi et al. | |
| 9,158,403 | B2 | 10/2015 | Kasamatsu | |
| 9,158,958 | B2 | 10/2015 | Wickboldt et al. | |
| 9,239,655 | B2 | 1/2016 | Hershman | |
| 9,316,677 | B2 | 4/2016 | Grunthaner et al. | |
| 9,323,972 | B2 | 4/2016 | Bussat et al. | |
| 9,460,332 | B1 | 10/2016 | Bussat | |
| 2005/0156906 | A1 | 7/2005 | Chiu | |
| 2007/0076923 | A1 * | 4/2007 | Chiu | 382/124 |
| 2008/0049980 | A1 * | 2/2008 | Castaneda et al. | 382/115 |
| 2008/0238878 | A1 | 10/2008 | Wang | |
| 2008/0267462 | A1 * | 10/2008 | Nelson et al. | 382/124 |
| 2009/0008729 | A1 | 1/2009 | Yang et al. | |
| 2009/0083847 | A1 * | 3/2009 | Fadell | G06F 21/316 726/16 |
| 2009/0085879 | A1 | 4/2009 | Dai et al. | |
| 2009/0257626 | A1 * | 10/2009 | Sherlock et al. | 382/126 |
| 2009/0260900 | A1 | 10/2009 | Ure | |
| 2009/0272639 | A1 * | 11/2009 | Mittleman | H01H 13/79 200/345 |
| 2010/0110019 | A1 | 5/2010 | Ozias et al. | |
| 2010/0156595 | A1 | 6/2010 | Wong et al. | |
| 2010/0176271 | A1 | 7/2010 | Krim et al. | |
| 2010/0201485 | A1 * | 8/2010 | Chou | 340/5.83 |
| 2010/0321159 | A1 | 12/2010 | Stewart | |
| 2011/0102569 | A1 | 5/2011 | Erhart | |
| 2011/0122082 | A1 | 5/2011 | Orellana | |
| 2011/0141048 | A1 * | 6/2011 | Brosnan et al. | 345/173 |
| 2011/0175703 | A1 * | 7/2011 | Benkley, III | G06K 9/00053 340/5.82 |
| 2011/0234623 | A1 | 9/2011 | Ure | |
| 2011/0267298 | A1 | 11/2011 | Erhart | |
| 2011/0298711 | A1 * | 12/2011 | Dean et al. | 345/161 |
| 2012/0085822 | A1 * | 4/2012 | Setlak | G06K 9/605 235/439 |
| 2012/0090757 | A1 * | 4/2012 | Buchan et al. | 156/60 |
| 2012/0097510 | A1 * | 4/2012 | Mitchell | 200/333 |
| 2012/0113044 | A1 | 5/2012 | Strazisar et al. | |
| 2012/0152711 | A1 * | 6/2012 | Silverman | 200/341 |
| 2012/0242635 | A1 * | 9/2012 | Erhart et al. | 345/207 |
| 2012/0267740 | A1 | 10/2012 | Okamoto | |
| 2012/0287587 | A1 * | 11/2012 | Los | 361/749 |
| 2013/0015868 | A1 | 1/2013 | Peng | |
| 2013/0141388 | A1 | 6/2013 | Ludwig | |
| 2013/0194071 | A1 | 8/2013 | Slogedal | |
| 2013/0271422 | A1 | 10/2013 | Hotelling et al. | |
| 2013/0279769 | A1 | 10/2013 | Benkley | |
| 2013/0307811 | A1 | 11/2013 | Pope et al. | |
| 2014/0103943 | A1 * | 4/2014 | Dunlap | G01N 27/221 324/663 |
| 2014/0135597 | A1 | 5/2014 | Wolf | |
| 2014/0216914 | A1 | 8/2014 | Pope et al. | |
| 2014/0218339 | A1 | 8/2014 | Hotelling et al. | |
| 2014/0241595 | A1 | 8/2014 | Bernstein | |
| 2014/0361395 | A1 | 12/2014 | Bhagavat et al. | |
| 2015/0002459 | A1 | 1/2015 | Watanabe et al. | |
| 2015/0022495 | A1 | 1/2015 | Bussat et al. | |
| 2015/0036065 | A1 | 2/2015 | Yousefpor et al. | |
| 2015/0070079 | A1 | 3/2015 | Yang et al. | |
| 2015/0248574 | A1 | 9/2015 | Mrazek et al. | |
| 2016/0004896 | A1 | 1/2016 | Pope et al. | |
| 2016/0092714 | A1 | 3/2016 | Yazdandoost et al. | |
| 2016/0092715 | A1 | 3/2016 | Yazdandoost et al. | |
| 2016/0092716 | A1 | 3/2016 | Yazdandoost et al. | |
| 2016/0217311 | A1 | 7/2016 | Bhagavat et al. | |
| 2016/0267313 | A1 | 9/2016 | Pope et al. | |

FOREIGN PATENT DOCUMENTS

| | | |
|---|---|---|
| CN | 1164076 | 11/1997 |
| CN | 1172308 | 2/1998 |
| CN | 1278347 | 12/2000 |

(56) References Cited

FOREIGN PATENT DOCUMENTS

| | | |
|---|---|---|
| CN | 1450489 | 10/2003 |
| CN | 1463409 | 12/2003 |
| CN | 1538142 | 10/2004 |
| CN | 1680818 | 10/2005 |
| CN | 1802882 | 7/2006 |
| CN | 101281589 | 10/2008 |
| CN | 101339951 | 1/2009 |
| CN | 101809581 | 8/2010 |
| CN | 101901092 | 12/2010 |
| CN | 202153359 | 2/2012 |
| EP | 0457398 | 11/1991 |
| EP | 0791899 | 8/1997 |
| EP | 0924656 | 6/1999 |
| EP | 1775674 | 4/2007 |
| JP | 2001339057 | 12/2001 |
| JP | 2012083829 | 4/2012 |
| KR | 20080035133 | 4/2008 |
| TW | M327066 U | 2/2008 |
| TW | 200937306 | 9/2009 |
| TW | 201017554 | 5/2010 |
| TW | 201017555 | 5/2010 |
| TW | 201229852 | 7/2012 |
| TW | 201346779 | 11/2013 |
| WO | WO 01/59558 | 8/2001 |
| WO | WO 2004/077340 | 10/2004 |
| WO | WO 2004/098083 | 11/2004 |
| WO | WO 2005/124659 | 12/2005 |
| WO | WO 2014/128249 | 8/2014 |

OTHER PUBLICATIONS

Setlak, Chapter 2: Advances in Fingerprint Sensors Using RF Imaging Techniques, Automatic Fingerprint Recognition Systems, Editor: Ratha et al., 2003, New York, Springer Verlag, US, pp. 27-53, XP002347781, ISBN: 978-0-387-95593-3.
Netherlands Search Report dated Feb. 5, 2015, NL 2013442, 7 pages.
Motorola User Guide, Motorola Atrix™ 4G (MB860), Manual No. 68XXXXX468-A, Motorola Mobility Inc., 2011, 90 pages.
Motorola Atrix (MB860), Manual No. 68014798001-B, Motorola Mobility Argentina S.A., 2011, 68 pages.
International Search Report and Written Opinion dated Dec. 23, 2014, PCT/US2014/054854, 8 pages.
Taiwanese Office Action dated Aug. 10, 2015, TW 103131229, 18 pages.
Australian Examination Report dated Jun. 17, 2016, AU 2016100377, 6 pages.

* cited by examiner

BIOMETRIC SENSOR STACK STRUCTURE

CROSS-REFERENCE TO RELATED APPLICATION

This application claims the benefit under 35 U.S.C. §119(e) of U.S. Provisional Patent Application No. 61/875,772, filed Sep. 10, 2013, and entitled "Biometric Sensor Stack Structure," the entirety of which is incorporated by reference as if fully enclosed herein.

BACKGROUND

Field of the Disclosure

This application generally relates to circuits and packaging for biometric sensors.

Background of the Disclosure

Capacitive sensing of biometric data provides for collection of biometric information, such as fingerprint information, in response to distinct measures of capacitance. such measures of capacitance can be between, on the one hand, one or more capacitive plates in a fingerprint recognition sensor, and on the other hand, ridges and valleys of a user's finger (such as the epidermis of the user's finger, or possibly, subdermal layers of the user's finger).

It sometimes occurs that measurements of capacitance involve introduction of electric charge on the epidermis of the user's finger. This can have the effect that only a small amount of charge can be introduced without the user feeling the charge, sometimes as a tingling or other noticeable effect on the epidermis of the user's finger.

It sometimes occurs that measurements of capacitance involve relatively small differences in capacitance between, on the one hand, the capacitive plates of the fingerprint recognition sensor, and on the other hand, the ridges and valleys of the user's finger. For example, this would involve placing the user's finger as close as possible to the capacitive plates. This can have the effect of limiting the design flexibility for the fingerprint recognition sensor.

It sometimes occurs that measurements of capacitance involve positioning of the user's finger with respect to the fingerprint recognition sensor. For example, the user's finger might have to be placed within a conductive ring, significantly limiting the size and position of the fingerprint recognition sensor. This can also have the effect of limiting the design flexibility for the fingerprint recognition sensor.

It sometimes occurs that measurements of capacitance involve capacitive coupling with a portion of the user's finger other than the epidermis. For example, capacitive coupling (or other fingerprint recognition sensing) might involve as a subdermal layer of the user's finger. This might involve introduction of a relatively greater electric charge to conduct that capacitive coupling. As described in part above, this can have the effect that the user might feel the charge, sometimes as a tingling or other noticeable effect in a portion of the user's finger.

Each of these examples, as well as other possible considerations, can cause difficulty for the fingerprint recognition sensor, and for the device incorporating the fingerprint recognition sensor (such as a computing device using fingerprint recognition for authentication). The fingerprint recognition sensor might be limited in size, or position, or in whether it can be relatively easily incorporated with other elements of the device incorporating the fingerprint recognition sensor. For a first example, this can have the effect that the fingerprint recognition sensor might not be easily incorporated into some types of devices (such as relatively small devices like smartphones and touchpads). For a second example, this can have the effect that the fingerprint recognition sensor might be required to be relatively fragile or otherwise subject to unwanted design constraints.

SUMMARY

This application provides techniques, including circuits and designs, which can receive information with respect to biometric images and data, such as fingerprint data, and which can be incorporated into devices using biometric recognition. For example, a fingerprint or other biometric sensor can be disposed beneath a control button or display element, for fingerprint recognition and authentication while the device is being operated by a user.

In one embodiment, techniques include providing a biometric recognition sensor disposed underneath other elements, but which is still disposed relatively close to the user's finger when fingerprint recognition is conducted. Circuits can be disposed underneath a button or underneath a display element, but with reduced amount of distance between one or more capacitive plates and the user's finger. For some examples, circuits can be disposed underneath a device element, with the fingerprint recognition sensor circuit itself having reduced vertical spacing by one or more of (1) coupling the fingerprint recognition sensor circuit using bonding wires disposed through one or more vias cut through a silicon wafer from the top of the circuit, (2) coupling the fingerprint recognition sensor circuit using bonding wires disposed through one or more trenches cut through a silicon wafer from an edge of the circuit, (3) encapsulating the fingerprint recognition sensor circuit in plastic molding which is at least partially removed, and (4) coupling the fingerprint recognition sensor circuit to other circuits using solder elements, such as encapsulated solder balls or compressed solder elements.

In one embodiment, circuits may embody or employ techniques which use elements of the device to aid the fingerprint recognition sensor in fingerprint recognition. For some examples, circuits can be disposed using one or more device elements, with the one or more device elements assisting the fingerprint recognition sensor circuit by one or more of (1) coupling capacitive elements to a side of the device or near a button or other device element, (2) printing circuit elements to assist the fingerprint recognition sensor, or included in the fingerprint recognition sensor, on an underside of a button or other device element, (3) coupling fingerprint recognition sensor circuit elements to a button or other device element which improves coupling an electric field of the fingerprint recognition sensor, such as an anisotropic element including sapphire or another substance, and (4) using a transparent or translucent button or other device element to perform optical sensing or infrared sensing in addition to capacitive sensing, to assist or be included in the fingerprint recognition sensor circuit.

In one embodiment, circuits include techniques which use elements of the device including the fingerprint recognition sensor circuit to assist the user when using the fingerprint recognition sensor. For some examples, circuits can be disposed using a device element, with the device element being disposed to assist the user by one or more of (1) using a recessed shape formed at least in part by a button or other device element to help position the user's finger for fingerprint recognition when using the fingerprint recognition sensor circuit, and disposing the fingerprint recognition circuit underneath the button or other device element, and (2) disposing the fingerprint recognition circuit over a touch-responsive push button to provide tactile feedback.

Another embodiment may take the form of a biometric sensor stack, comprising: a cap; a trim surrounding the cap and defining a ground ring; a sensor positioned beneath the cap; and a switch positioned beneath the sensor. In some embodiments, the cap, trim, and sensor all move when the cap is pressed; and the switch collapses when the cap is pressed. In still more embodiments, the sensor is operative to capture biometric data while the switch generates an electrical signal. In embodiments, the sensor is operative to capture data from multiple fingers in contact with the cap.

While multiple embodiments are disclosed, including variations thereof, still other embodiments of the present disclosure will become apparent to those skilled in the art from the following detailed description, which shows and describes illustrative embodiments of the disclosure. As will be realized, the disclosure is capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the present disclosure, it is believed that the disclosure will be better understood from the following description taken in conjunction with the accompanying Figures, in which:

DETAILED DESCRIPTION

This disclosure is directed to fingerprint sensor systems for electronic devices, including, but not limited to, fingerprint image sensors for smartphones (or smart phones), tablet computers, media players, personal computers, and other portable electronics and mobile devices. In some designs, the fingerprint sensor is disposed beneath a control button or display element, so that fingerprint recognition and authentication can be performed while the device is being operated by a user.

The fingerprint sensor itself may utilize a grid of capacitive elements for capturing the fingerprint image, or an optical sensor or other suitable fingerprint imaging technology. A control circuit can also be provided, for example a control button or switch element responsive to touch or pressure, or a touchscreen control system responsive to proximity and (multiple) touch positioning. In some designs, the fingerprint sensor is utilized in combination with a control button or display element formed with an anisotropic dielectric material, such as sapphire.

The examples and embodiments described herein generally disclose various structures and methods for packaging a sensor, such as a capacitive sensor. Some embodiments incorporate various placements of the sensor, structure surrounding a sensor, connection structures (electrical, physical, or both), and techniques for enhanced sensor imaging, sensor retention, and guiding a user's finger to a proper location above a sensor, where the sensor itself cannot be seen.

Additional examples and embodiments describe placement of the sensor with respect to the device, for example a sapphire button or lens element disposed in a recess in a cover glass or frame structure. In other examples, the sensor may be embedded into an (e.g., laminated) cover glass system, or within the structure or housing of the device. The device housing or frame may also include an opening or sensor aperture in which the sensor is placed, with plastic or another material molded above the sensor, for example using an encapsulated sensor design. The over-molded or encapsulating material may form part of the lens or button structure, or a sapphire material may be used.

FIG. 1

Figure 1:
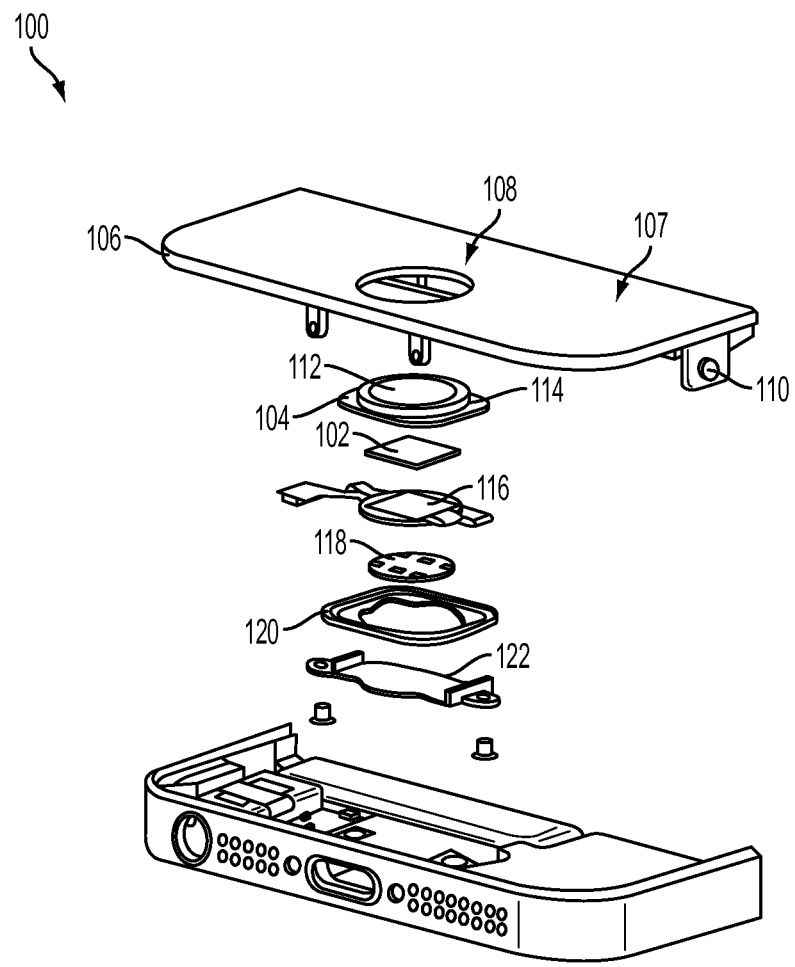
FIG. 1 shows a conceptual drawing of a fingerprint recognition sensor included in a portion of a device.

FIG. 1 shows a conceptual drawing of a fingerprint recognition sensor 102 included in a portion of a device 100.

An exploded view figure of a portion of a device 100 shows an assembly of parts disposed to form the fingerprint recognition sensor 102 circuit and position the sensor 102 circuit below a push button. While this application describes a particular assembly with a particular push button and a particular sensor 102 circuit, in the context of the invention, there is no particular requirement for any such limitation. For example, the push button might be disposed somewhat off-center from the fingerprint recognition sensor 102 circuit, with the effect that the push button is still effective for its purpose, while the sensor 102 circuit still operates in conjunction with positioning of the user's finger nearby. After reading this application, those skilled in the art would recognize that many other and further example assemblies would be within the scope and spirit of the invention, would be workable, and would not require further invention or undue experiment.

A cover glass (CG) frame 106 is disposed to be coupled to a cover glass 107 of a smartphone, touchpad, portion of a mobile computing device, input mechanism, key of a keyboard, portion of an input or output device housing, panel or body of a vehicle, appliance or the like, touch screen or other device 100, and disposed to be coupled to a frame of the device 100. (In many embodiments, the device 100 is some form of mobile computing device.) The cover glass frame 106 includes a button hole 108 disposed to position a push button, and also includes one or more screw holders 110 disposed to be matched to external screw locations and disposed to receive horizontal screws for holding the cover glass frame 106 in place at a base plate (as further described below) when the assembly is constructed.

The button hole 108 in the cover glass frame 106 is disposed to hold a button 104 (which can form a top element of a push button, as described below), as shown in the figure. The button 104 is disposed to fit into the button hole 108. The button 104 includes a lens 112, at least a portion of the lens 112 helping to form a recessed shape, with the effect of guiding the user's finger onto the button 104. The recessed shape may likewise be at least partially formed by a chamfer in the ground ring. In one embodiment, the button 104 can be made of one or more of the following materials, or equivalents thereof: aluminum oxide, glass or chemically treated glass, sapphire, a chemically treated compound having at least some characteristics thereof, or another compound having similar properties. The lens 112 is disposed within a ground ring 114. In one embodiment, the ground ring 114 can be used to shield electromagnetic effects, with the effect of providing capacitance isolation or other electromagnetic isolation. The ground ring 114 is shown in the figure as having a cylindrical edge which holds the lens 112, and a base plate which can be aligned or oriented within the device 100 when the assembly is constructed.

The button 104 is disposed above and coupled to a fingerprint recognition sensor 102 circuit. In one embodiment, the fingerprint recognition sensor 102 circuit is relatively rectangular, with the effect of being able to sense a two dimensional (2D) image of the user's fingerprint. However, in alternative embodiments, the fingerprint recognition sensor 102 circuit can be disposed on another shape, such as a circular or hexagonal shape which might also be suited to receiving 2D fingerprint image information.

As described below, the fingerprint recognition sensor 102 includes a silicon wafer 308 (see FIG. 3) onto which a fingerprint recognition circuit is disposed, the fingerprint recognition circuit being electrically coupled to other elements of the device 100. The fingerprint recognition circuit is disposed relatively close to the user's finger, with the effect that the fingerprint recognition circuit can collect fingerprint image information in response to the ridges and valleys of the user's finger in response to measures of capacitance at each point on the user's finger. Electrical coupling between the fingerprint recognition circuit and other elements of the device 100 is further described below.

As described above, while this application primarily describes an assembly in which the fingerprint recognition sensor 102 circuit is disposed for capacitive coupling to the epidermis of the user's finger, in the context of the invention, there is no particular requirement for any such limitation. For example, the fingerprint recognition sensor 102 circuit might be capacitively coupled, or otherwise electromagnetically coupled, to a subdermal portion of the user's finger. Moreover, the fingerprint recognition sensor 102 circuit might work in combination or conjunction with elements which perform optical sensing, infrared sensing, or other sensing of the user's fingerprint, and which themselves might be coupled either to the epidermis of the user's finger, to a subdermal portion of the user's finger, or to some other feature representative of the user's fingerprint.

In one embodiment, the fingerprint recognition sensor 102 includes an integrated circuit, including one or more capacitive plates arranged in a two dimensional (2D) array, each such capacitive plate disposed for collecting at least some fingerprint image information in response to the ridges and valleys of the user's finger at one or more pixels in an array thereof. This has the effect that, while each capacitive plate collects one or more pixels of fingerprint image information in an array thereof, the set of those capacitive plates collectively receives a 2D array of fingerprint image information. For example, a 2D array of fingerprint image information can be used to determine substantial features of the user's fingerprint, which can be used to enroll the user's fingerprint in a database for later use, or which can be compared at a later time against enrolled fingerprint image information to recognize the user's fingerprint and possibly to authenticate the user in response to that fingerprint image information.

The fingerprint recognition circuit is disposed above and coupled to a flexible element 116, the flexible element 116 being disposed both to receive any force imposed by the user's finger on the button 104, and to transmit that force to a tactile dome switch 118 (as further described below). The flexible element 116 is also disposed to receive electrical signals (such as representing fingerprint image information) from the fingerprint recognition sensor 102, and transmit those electrical signals from the fingerprint recognition sensor 102 to a processor.

The flexible element 116 is disposed above and coupled to a tactile dome switch 118, which receives any force imposed by the user's finger on the button 104, transmits an electrical signal representing the user's finger having pushed the button 104 to a push button circuit, and optionally provides tactile feedback to the user's finger to indicate that the button 104 has been pushed.

As further described herein, disposing the tactile dome switch 118 in a column with the fingerprint recognition sensor 102 circuit has the effect that the user's fingerprint can be recognized when the user positions their finger on the button 104. For example, the user might position their finger on the button 104 as part of a power-on or start-up sequence for the device 100, at which time the device 100 might concurrently both (A) act on the power-on or start-up sequence, and (B) receive fingerprint image recognition with respect to the user's finger, such as for enrollment or authentication of the user.

The tactile dome switch 118 is disposed above and coupled to a switch gasket 120, which holds the tactile dome switch 118, and which is held in place by a button support plate 122. The button support plate 122 is coupled to the base plate, and held in place by one or more vertical screws. As described above, the base plate is also held in place with the cover glass frame 106 by the one or more horizontal screws. In one embodiment, the base plate also has other elements, such as holes for interfacing other device elements, such as a microphone jack or other elements.

After reading this application, those skilled in the art would recognize that this particular disposition of the assembly as described is not absolutely required, and that many variants thereof would be workable and would be within the scope and spirit of the invention, and would not require further invention or undue experiment.

In one particular, the positioning of the fingerprint recognition sensor 102 circuit in relatively vertical alignment with the tactile dome switch 118 allows the device 100 to combine the functions of receiving fingerprint image information and button-push information concurrently.

FIG. 2

Figure 2:
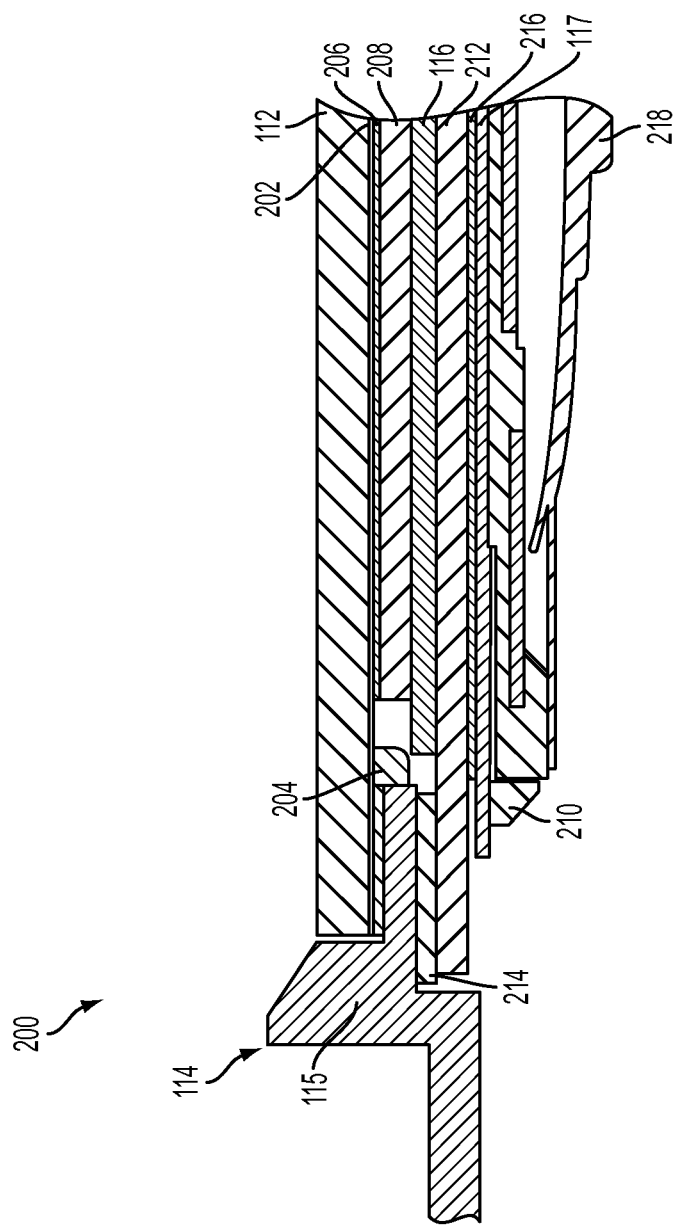
FIG. 2 shows a conceptual drawing of a button assembly, showing the laminated layers, as partially described with respect to FIG. 1.

FIG. 2 shows a conceptual drawing of a button assembly 200, showing the laminated layers, as partially described with respect to FIG. 1.

The button assembly 200 as described with respect to FIG. 1 includes the lens 112, as described above, with a recessed shape formed at least in part by a portion of the lens 112 to guide the user's finger onto the button 104. As described above, the lens 112 is disposed within the ground ring 114, which optionally includes a button flange 115 surrounding the sides of the button 104. In one embodiment, the button flange 115 can also cause a portion of the recessed shape to be formed at least in part by the button flange 115, again for the purpose of guiding the user's finger onto the button 104.

An ink assembly, in one embodiment including 2-5 layers of ink 202, is disposed below the lens 112. In one embodiment, the ink assembly can be printed on the lens 112, vapor deposited thereon, or applied by another technique. This has the effect that the otherwise-translucent button 104 can be made opaque, so the elements of the fingerprint recognition sensor are not immediately visible to the user. The lens 112 is coupled at its edges to the ground ring 114 using a heat activated film and a perimeter sealant 204.

As described above, the fingerprint recognition sensor circuit is disposed below the lens 112. A liquid lamination layer 206 is disposed below the lens 112 with which to couple the fingerprint recognition sensor circuit. The fingerprint recognition sensor circuit includes a silicon package 208, including a silicon circuit layer, solder (as shown in further detail below), and underfill 210 (as shown in further detail below).

As further described herein, the fingerprint recognition sensor circuit exhibits capacitive coupling with the ridges and valleys of the user's finger, such as at the epidermis of the user's finger, with the effect that the fingerprint recognition sensor receives 2D fingerprint image information, from which the device can determine whether the fingerprint is the user's fingerprint or some other person's fingerprint. As noted above, the fingerprint recognition sensor circuit might also or instead exhibit capacitive coupling with another portion of the user's finger, such as a subdermal layer thereof, or with another feature of the user's finger.

As described above, the fingerprint recognition circuit is disposed above and coupled to a flexible element 116. The flexible element 116 is coupled to a stiffener element 212. The edges of the ground ring 114 which holds the lens 112 are coupled using a liquid adhesive 214 to the stiffener element 212. The stiffener element is disposed above and coupled to a high-strength bonding tape, such as VHB tape 216, which is in turn disposed above and coupled to a flexible element 117 and to the tactile switch (button switch) 218.

After reading this application, those skilled in the art would recognize that the assembly as described provides the fingerprint recognition sensor with relatively lesser distance to the user's finger, and relatively lesser stacking height, while concurrently allowing the user to access a push button or other element of the device using the fingerprint recognition sensor, without further invention or undue experiment.

In a first particular, the assembly as described above includes a recessed shape with the effect that the user's finger is guided to a position where the fingerprint recognition sensor can have superior effect. The recessed shape is formed at least in part by a portion of the shape of the button 104, including the lens 112 and (optionally) by a portion of the shape of the ground ring 114. As described above, the fingerprint recognition sensor is disposed below the button 104, with the effect that, when the user's finger is guided into the recessed shape, the user's finger is well positioned for fingerprint recognition.

In a second particular, the assembly as described above includes a tactile push button at the bottom of the stack of elements, with the effect that the fingerprint recognition sensor can have superior effect in response to being positioned relatively closer to the epidermis of the user's finger, while concurrently the user can use the push button and also have tactile feedback effect from pushing or releasing that push button. As described herein, disposition of the push button in a substantially vertical stack with the fingerprint recognition sensor circuit both (A) allows the device to accept a push button operation from the user, and concurrently perform fingerprint recognition on the user's finger which is pushing the button 104, and (B) allows the device to exhibit relatively superior capacitive coupling between the fingerprint recognition sensor circuit and the user's finger, without disposing either the push button or the fingerprint recognition sensor circuit too far from the user's finger.

FIG. 3

Figure 3:
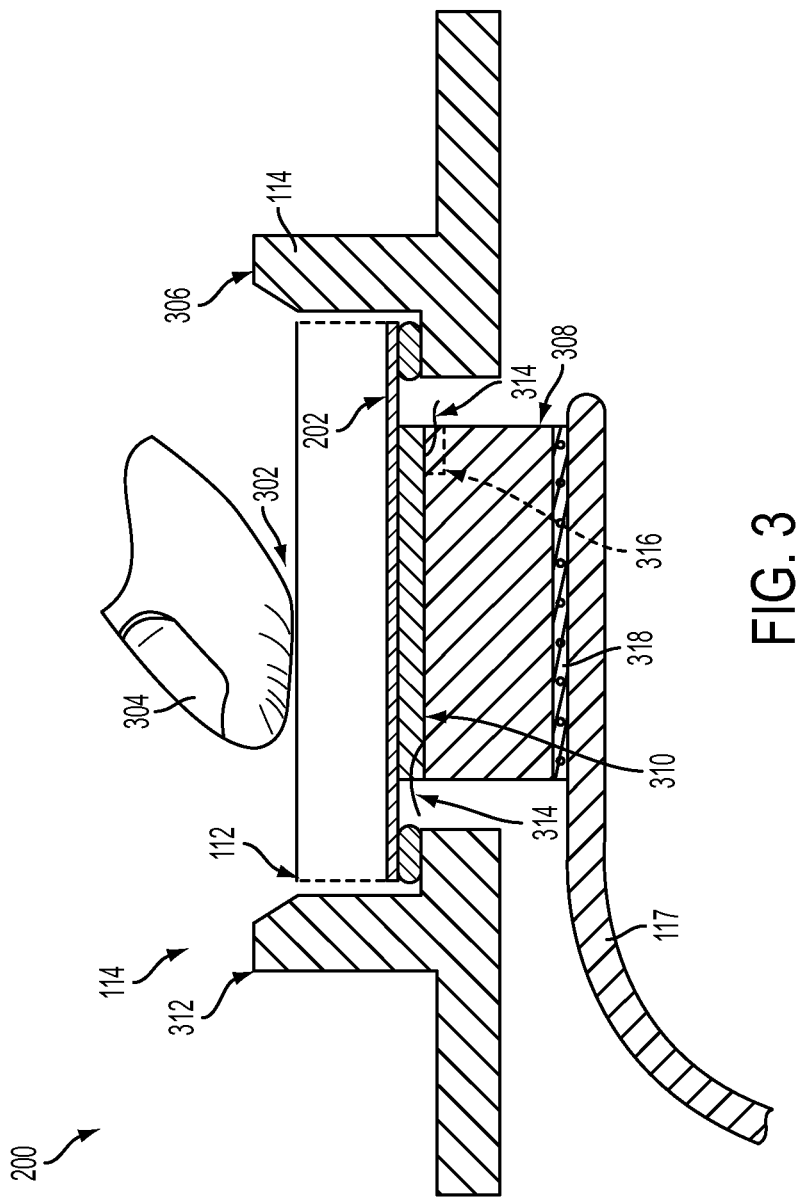
FIG. 3 shows another conceptual drawing of a button assembly, showing the fingerprint recognition sensor, as partially described with respect to FIG. 1.

FIG. 3 shows another conceptual drawing of a button assembly 200, showing the fingerprint recognition sensor, as partially described with respect to FIG. 1.

A set of ridges and valleys 302 of the user's fingerprint are shown disposed above the button assembly 200, with the ridges and valleys 302 having the property that ridges of the user's fingerprint are relatively closer to the external surface of the button 104, while valleys of the user's fingerprint are relatively farther away from the external surface of the button 104. As described above, the fingerprint recognition sensor circuit exhibits capacitive coupling with the ridges and valleys 302 of the user's finger, such as at the epidermis of the user's finger 304, with the fingerprint recognition sensor circuit being positioned relatively close to the epidermis of the user's finger 304.

FIG. 3 similarly shows the button assembly 200 as described with respect to FIG. 1, including a recessed shape 306 formed at least in part by a portion of the shape of the lens 112, to guide the user's finger 304 onto the button 104, and including the structure for ground ring 114, optionally also including a portion of the recessed shape 306, again to guide the user's finger 304 onto the button 104. FIG. 3 similarly shows the ink assembly 202 disposed below and coupled to the lens 112, with the effect that the otherwise-translucent button 104 is made opaque, so the elements of the fingerprint recognition sensor are not immediately visible to the user. FIG. 3 similarly shows the fingerprint recognition sensor disposed below and coupled to the lens 112.

The fingerprint recognition sensor includes a silicon wafer 308, imprinted with a circuit 310 for measuring a capacitance between, on the one hand, one or more capacitive plates, and on the other hand, the user's fingerprint (such as the ridges and valleys 302 on the epidermis of the user's finger 304), with the effect of providing fingerprint image information with respect to ridges and valleys 302 of the user's finger 304. The ground ring 114 provides electrical isolation, with the effect that the capacitance that is measured is between the user's finger 304 and the fingerprint recognition sensor, not between any other object and the fingerprint recognition sensor. The ground ring 114 may be formed adjacent or near the lens 112 of the button 104. As one example, the ground ring 114 may be incorporated into, or formed on a side of, a structure 312 for supporting or integrating the ground ring 114, such as a button flange 115.

In one embodiment, the silicon wafer 308 includes one or more through-silicon vias (TSVs), disposed to provide an electrical connection between, on the one hand, the circuitry 310 disposed on a top of the silicon wafer 308, and on the other hand, circuitry disposed either below or to the side of the silicon wafer. This has the effect that bonding wires 314 need not be arced up from the surface of the silicon wafer 308 to connect circuitry 310 from the silicon wafer 308 to elsewhere.

Using bonding wires 314 arcing up from the surface of the silicon wafer 308 would otherwise occupy vertical space between the silicon wafer 308 and the object next above the silicon wafer 308. Using through-silicon vias to connect the circuitry 310 disposed on the top of the silicon wafer 308 to another location (such as circuitry at the bottom of the silicon wafer 308, or circuitry to the side of the silicon wafer 308) has the effect that a lesser amount of vertical space is needed for the fingerprint recognition sensor, with the effect that the fingerprint recognition sensor can be placed closer to the user's finger 304 and can have relatively better resolution and effectiveness.

In one embodiment (possibly used concurrently with embodiments having through-silicon vias), the silicon wafer 308 includes one or more edge trenches 316, that is, trenches etched or dug through the silicon wafer 308 from, on the one hand, the circuitry 310 disposed on the top of the silicon wafer 308, to on the other hand, circuitry disposed to a side of the silicon wafer 308. This also has the effect that bonding wires 314 need not be arced up from the surface of the silicon wafer 308 to connect circuitry 310 from the silicon wafer to elsewhere. As described above, reducing the need to arc bonding wires 314 up from the surface of the silicon wafer 308 reduces the amount of vertical space needed between the user's finger 304 and the fingerprint recognition sensor.

In one embodiment (again, possibly used concurrently with other embodiments described above), the silicon wafer 308 is constructed by means of encapsulation in a plastic resin or other elastomeric material (or alternatively, in a ceramic), followed by removal of a top portion of the plastic resin or elastomer to the point where the wiring of the circuit 310 disposed on the top of the silicon wafer 308 is nearly exposed, or alternatively, just barely exposed. This has the effect that the fabricated silicon wafer 308 uses as little vertical space as reasonably possible, as there is relatively limited amount of extra vertical space used by wafer packaging for the finger recognition sensor.

In one embodiment, the silicon wafer 308 is constructed including a set of solder balls 318 which are randomly (or pseudo-randomly) disposed coupled to the wafer 308. Optionally, the solder balls 318 need not include actual solder, but may include other electrically conductive material, such as gold, other deformable metals, or other electrically conductive or semiconductive material which can be deformed in response to a physical process such as pressure. The solder balls 318 can be encapsulated in a plastic resin, followed by compression of the layer of solder balls 318 and plastic resin to the point where the solder balls 318 and plastic resin are compressed. This has the effect that the plastic resin is substantially squeezed away from the solder balls 318, and the solder balls 318 are disposed to conduct electrical signals between the silicon wafer 308 and other elements, such as the button 104. As the solder balls 318, or other material, are dispersed horizontally in their layer, this also has the effect that their layer operates to conduct from a layer above to a layer below, without any conduction horizontally across or within their layer.

In those cases in which the silicon wafer 308 is coupled to the button 104, this has the effect that conduction is increased between the capacitive plates of the silicon wafer 308 and the surface of the button 104. This in turn has the effect that the capacitance between the user's finger 304 and the silicon wafer 308 is increased, due to reduced distance between the epidermis of the user's finger 304 and the silicon wafer 308. This in turn allows the fingerprint recognition sensor to achieve superior capacitance sensing of the user's fingerprint image information.

Figure 4A:
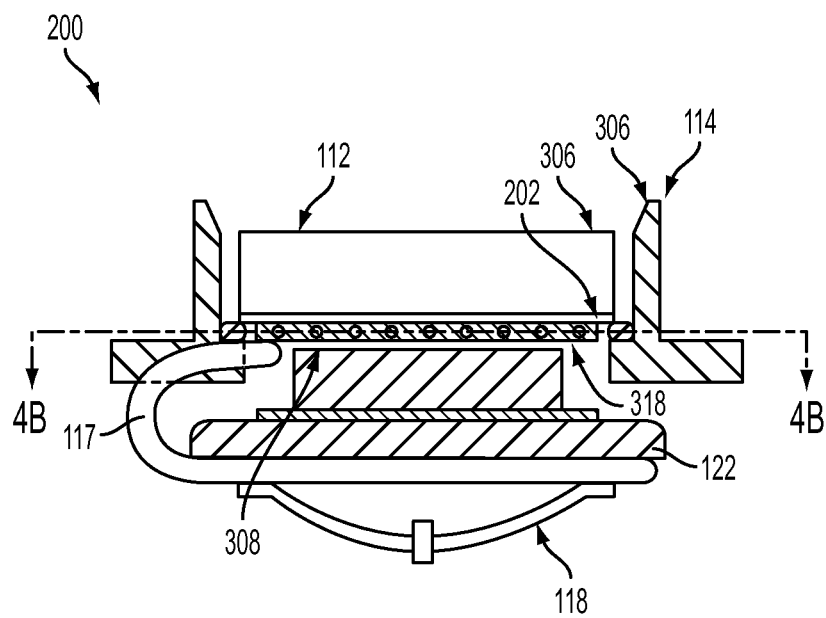
FIGS. 4A and 4B show another conceptual drawing of a button assembly, showing the fingerprint recognition sensor, as partially described with respect to FIG. 1.
Figure 4B:
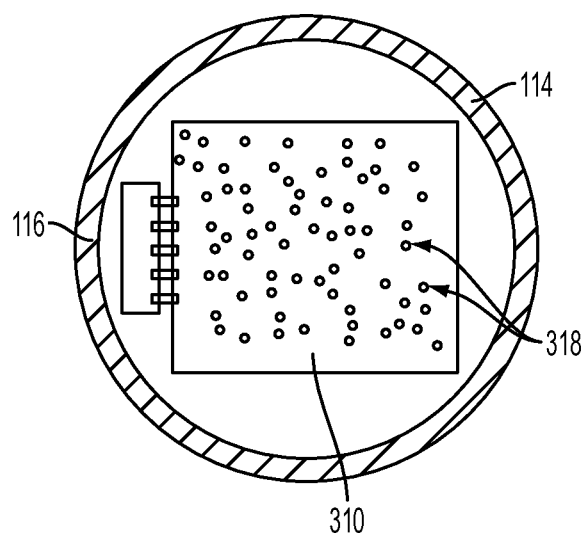

FIGS. 4A and 4B

FIGS. 4A and 4B show another conceptual drawing of a button assembly 200, showing the fingerprint recognition sensor, as partially described with respect to FIG. 1.

FIGS. 4A and 4B show both (FIG. 4A) a side cut-away view of the button 104 and fingerprint recognition sensor, and (FIG. 4B) a top view of the fingerprint recognition sensor silicon wafer 308.

As described above, the button 104 includes a lens 112 (which may be constructed from a variety of materials, such as glass, aluminum oxide, plastic, resins and the like), having a recessed shape 306 to guide the user's finger onto the button 104. As described above, the lens 112 is disposed within the ground ring 114 (for example, constructed of anodized aluminum, such as SOS aluminum). As described above, the ground ring 114 provides electrical isolation, with the effect that the capacitance that is measured is between the user's finger and the fingerprint recognition sensor, not between any other object and the fingerprint recognition sensor.

The ground ring 114 is shown in the figure as having a cylindrical edge which holds the lens 112, and a base plate which can be aligned or oriented within the device when the assembly is constructed. In alternative embodiments, instead of a ground ring 114, one or more capacitive plates may be disposed at a side of the user's finger, with the effect of providing capacitive isolation, so that any capacitive coupling that occurs is only between the user's finger and the fingerprint recognition sensor. For example, capacitive plates may be disposed surrounding a region in which the fingerprint recognition sensor is located, with the effect of surrounding the fingerprint recognition sensor with capacitive isolation. Similarly, capacitive plates may be disposed near or inside a casing for the device, such as a casing for a smartphone or other device, also with the effect of surrounding the fingerprint recognition sensor with capacitive isolation.

As described above, disposed below and coupled to the lens 112 is a layer of ink 202.

In one embodiment, the fingerprint recognition sensor includes a set of capacitive plates, disposed in a 2D array including pixels having a density of approximately 300 dots per inch (dpi) or thereabouts (or optionally, a greater or lesser density), with the effect of providing 2D fingerprint image information with respect to the user's finger. In one embodiment, the 2D fingerprint image includes a set of grayscale values, one or more such values for each pixel, with the effect of providing a 2D set of grayscale values to be sent to a processor for fingerprint recognition.

As described above, the one embodiment, the silicon wafer 308 assembly is constructed including a set of solder balls 318 which are randomly (or pseudo-randomly) disposed coupled to the wafer 308 and encapsulated in a compressed layer of plastic resin. Even when randomly or pseudo-randomly disposed, the set of solder balls 318 provides a substantially even measure of electrical connectivity between the silicon wafer 308 and other circuitry, such as the flexible element 116 or 117, or both, described below.

As shown in the figures, the solder balls 318, or other material, can be disposed in one or more of: (A) a layer above the silicon wafer 308, with the effect that the silicon wafer 308 is electrically coupled at least in part to that layer there-above, (B) a layer below the silicon wafer 308, with the effect that the silicon wafer 308 is electrically coupled at least in part to that layer there-below.

As described above, a flexible element 116 or 177 is coupled to the silicon wafer 308, with the effect that the silicon wafer 308 can be pressed down when the button 104 is pressed, without substantial risk to the structure of the wafer 308. The figure shows a set of connectors between the flexible element 116 or 117 and the silicon wafer 308, with the effect that when the button 104 is pressed down, the flexible element 116 or 117 flexes, causing the wafer 308 to be depressed without structural strain.

As described above, a support plate 122 is positioned below and coupled to the wafer 308. A dome structure is positioned below and coupled to the support plate 122, providing a tactile response to the user when the button 104 is pushed.

FIG. 5

Figure 5:
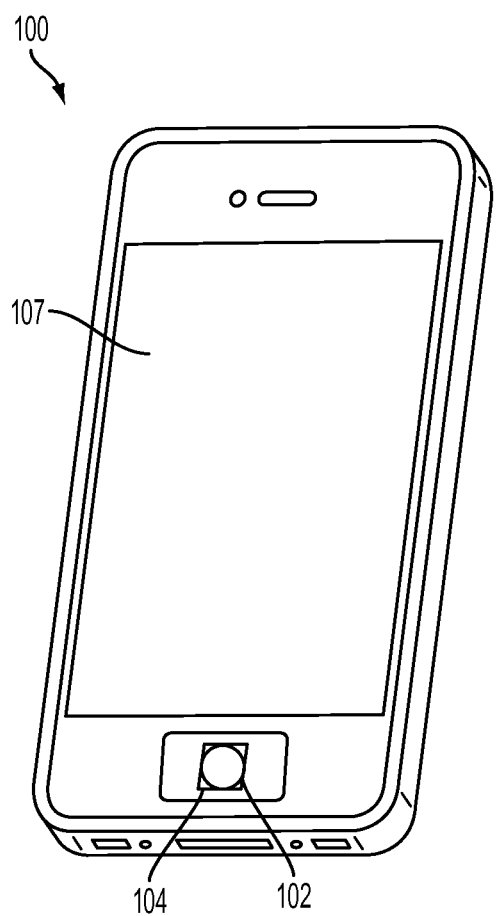
FIG. 5 shows a conceptual drawing of a device with button assembly, showing the fingerprint recognition sensor, as partially described with respect to FIG. 1.

FIG. 5 shows a conceptual drawing showing a relationship between a button assembly 200 and a fingerprint recognition sensor 102.

In one embodiment, the button 104 includes an element including a material as described above, such as treated glass or sapphire, forming, at least in part, a recess-shaped indentation to guide the user's finger toward a central location where best use can be made of the fingerprint recognition sensor circuit. For example, as shown in the figure, a portion of the device 100 relatively closer to the user can include a relatively larger button element (shown as a horizontally-oriented rectangle), which overlays a relatively recess-shaped indentation (shown as a dotted circle), which overlays a fingerprint recognition sensor circuit (shown as a square approximately the same size as the dotted circle). This has the effect that the user can easily locate the fingerprint recognition sensor circuit by feel or touch, and can easily orient their finger with respect to the fingerprint recognition sensor circuit. This also has the effect that the fingerprint recognition sensor circuit can be made substantially larger than it would be if required to fit inside a circular ground ring surrounding the push button, as the user's finger is relatively well positioned with respect to the fingerprint recognition sensor.

In one embodiment, there is no particular requirement for a specific ground ring. The device 100 can include capacitive plates or grounding elements which are positioned to the sides of the fingerprint recognition sensor circuit, with the effect that the fingerprint recognition sensor circuit exhibits capacitive isolation, and with the effect that the fingerprint recognition sensor circuit has capacitive coupling to the epidermis of the user's finger, rather than to some outside electromagnetic source of interference. For example, the device 100 can include capacitive plates or grounding elements in one or more of (A) directly to the sides of the fingerprint recognition sensor circuit, positioned inside the device 100 and near the push button, (B) on the sides of the device housing, or a sub-housing including the push button, or (C) otherwise positioned on or in the device housing, or a sub-housing including the push button.

In one embodiment, there is no particular requirement for a physical tactile sensor, such as a spring or other tactile element, for the push button. For example, the device 100 can include one or more sensors capable of determining whether the user is pressing on the cover glass 107 (such as whether the user is pressing on the cover glass 107 in a recessed depression indicating where to press). As described above, the recessed depression indicating where to press also helps to position the user's finger above the fingerprint recognition sensor circuit.

In a first example, the device 100 can include one or more sensors capable of determining whether the user is pressing on the cover glass 107 by measuring a ratio of area of the user's fingerprint area touching the glass. Such sensors can be responsive to an area of the cover glass 107 obscured by the user's fingerprint, with the effect that when the user is pressing harder on the cover glass 107, the area covered by the user's finger would change from a relatively small dot (when barely touching) to a relatively larger area (when pressing harder) to a relatively maximal area (when the user's finger is substantially completely pressed against the cover glass 107).

In a second example, the device 100 can include one or more sensors capable of determining whether the user is pressing on the cover glass 107 by measuring a ratio of ridges of the user's fingerprint area touching the glass (or otherwise disposed relatively near the glass). Such sensors can be responsive to a number of ridges of the user's fingerprint, with the effect that when the user is pressing harder on the cover glass 107, the number of ridges of the user's fingerprint would change from a relatively small number (when barely touching) to a relatively larger number (when pressing harder) to a relatively maximal number (when the user's finger is substantially completely pressed against the cover glass 107).

In a third example, the device 100 can include one or more sensors capable of determining whether the user is pressing on the cover glass 107 using a strain gauge, with optional compensation for temperature. Such sensors can measure a relative amount of strain on the cover glass 107 from pressure by the user's finger, with the effect that when the user is pressing harder on the cover glass 107, the amount of strain would change from a relatively minimal value (when barely touching) to a relatively larger value (when pressing harder) to a relatively maximal value (when the user's finger is substantially completely pressed against the cover glass 107).

In some embodiments, a rigid substrate may be used in addition to, or instead of, the flexible element 116. In such embodiments, a sensor may be attached to the rigid substrate and placed beneath the lens. A tactile switch, or other pressure-sensitive feedback device, may be attached to the underside of the rigid substrate. Alternately, the pressure-sensitive feedback device or switch may be mounted with its underside down to another circuit element, such as another rigid substrate, while the first rigid substrate serves as a bottom support plate.

In one embodiment, the fingerprint recognition sensor circuit can take advantage of one or more electrical characteristics of the button 104, such as an anisotropy of the button material (such as an aluminum oxide, sapphire or another anisotropic material), to allow the fingerprint recognition sensor circuit to better sense the epidermis of the user's finger (or optionally, a subdermal portion of the user's finger). This has the effect that the fingerprint recognition sensor circuit would exhibit relatively superior capacitive coupling to the user's finger by virtue of the anisotropy of the button material, with the effect that the fingerprint recognition sensor circuit would obtain a relatively superior set of fingerprint image information. Similarly, where applicable, the fingerprint recognition sensor circuit can make use of other electromagnetic properties of the button material to exhibit relatively superior capacitive coupling to the user's finger by virtue of those other electromagnetic properties of the button material.

Figure 7:
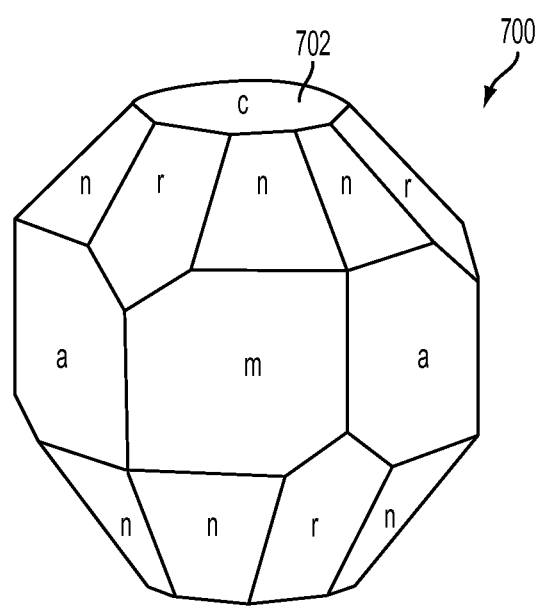
FIG. 7 generally shows a sample crystal lattice structure 700 for sapphire.

It should be appreciated that anisotropic dielectric materials may be used to form one or more layers above the capacitive sensor, such as a cover glass 107 or button surface layer. Anisotropic dielectrics may reduce blurring that is otherwise introduced by distance between a capacitive fingerprint sensor array and a finger's surface (or subsurface). For example, orienting a sapphire layer covering or extending between the finger and capacitive sensor array may enhance imaging. The sapphire layer may be oriented such that one of its axes perpendicular to its C-plane (such as the M-plane and A-plane) extends between the sensor imaging array and the surface to be contacted by, or near, a finger that is to be imaged. Generally, sapphire axes perpendicular to the C-plane may have a higher dielectric constant than directions parallel to the C-plane and thus enhance capacitive sensing and/or imaging. Although either mono-crystalline or polycrystalline sapphire may be used in various embodiments, certain embodiments may specifically employ mono-crystalline sapphire. FIG. 7 generally shows a sample crystal lattice structure 700 for sapphire, with the critical plane 702 (in this case, the C-plane) oriented as a top surface.

In one embodiment, the fingerprint recognition sensor circuit can include elements which are coupled to the button 104, with the effect that the fingerprint recognition sensor circuit can take advantage of additional physical and electrical characteristics of the button 104.

For a first example, the fingerprint recognition sensor circuit can include circuit elements which are printed on a surface of the button 104, such as a bottom surface positioned away from the user's finger and thus relatively immune from damage.

For a second example, the fingerprint recognition sensor circuit can include circuit elements which are deposited on a surface of the button 104. In such examples, those circuit elements can be deposited using etching, sputtering, or other techniques for integrating semiconductor circuits onto the surface of a relatively non-conducting surface.

In one embodiment, the fingerprint recognition sensor circuit can be assisted by an optical element, such as one which uses a transparent characteristic of the button 104. For example, an optical element can obtain an optical view of the epidermis of the user's finger (whether determined as a still picture, as a sequence of still pictures, or as a video sequence). In one example, that optical view could be processed with respect to optical differences detected between the ridges and valleys of the user's finger, such as any shadowing differences that might be present. Shadowing differences could be present due to ambient light, or due to an optical (or optionally, infrared or another applicable electromagnetic frequency) source from within the device 100.

In one embodiment, the fingerprint recognition sensor circuit can be assisted by an infrared sensing element, such as one which uses a transparent or translucent characteristic of the button 104. For example, an infrared sensing element can obtain an infrared view of the epidermis of the user's finger or a subdermal portion of the user's finger (whether determined as a still picture, as a sequence of still pictures, or as a video sequence). In one example, that infrared view could be processed with respect to infrared differences detected between the ridges and valleys of the user's finger, such as any temperature differences or infrared frequency differences that might be present. Temperature differences or infrared frequency differences could be present due to an internal temperature of the user's finger, or due to an optical, infrared, or other applicable electromagnetic frequency, source from within the device 100.

In such examples, the capacitive coupling between the fingerprint recognition sensor circuit and the epidermis of the user's finger, and any optical information or infrared information, could be combined to form a unified set of fingerprint image information. Alternatively, in such examples, the capacitive coupling between the fingerprint recognition sensor circuit and the epidermis of the user's finger, and any optical information or infrared information, could be processed separately to recognize the user's fingerprint, with one or more thereof being required, or optionally weighted, to achieve recognition of the user's fingerprint.

Certain aspects of the embodiments described in the present disclosure may be provided as a computer program product, or software, that may include, for example, a computer-readable storage medium or a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

Figure 6:
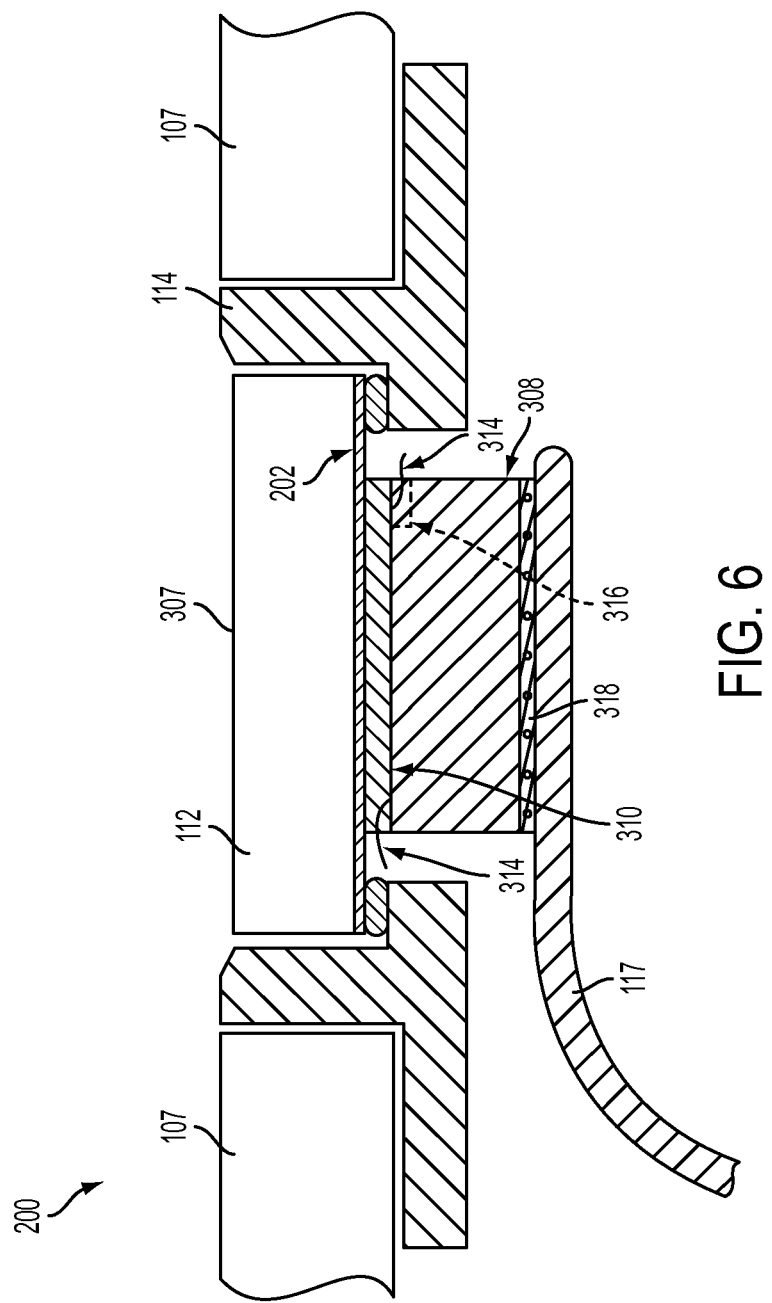
FIG. 6 shows another conceptual drawing of a button assembly, in a recessed design with a flat lens.

FIG. 6 shows another conceptual drawing of a button assembly 200, showing the fingerprint recognition sensor, as partially described with respect to FIG. 1.

FIG. 6 similarly shows the button assembly 200 with a substantially flat or planar lens 112, which may be slightly recessed with respect to the cover glass 107 of an electronic device such as device 100, as described with respect to FIG. 1. In this design the lens 112 has a flat shape 307 formed at least in part by a portion of the shape of the lens 112, to accommodate the user's finger onto the button 104, including the structure for ground ring 114, optionally also including a portion of the flat shape 307, in either a flush, slightly recessed, or slightly proud arrangement with respect to lens 112. FIG. 3 similarly shows the fingerprint recognition sensor disposed below and coupled to the lens 112.

Figure 8:
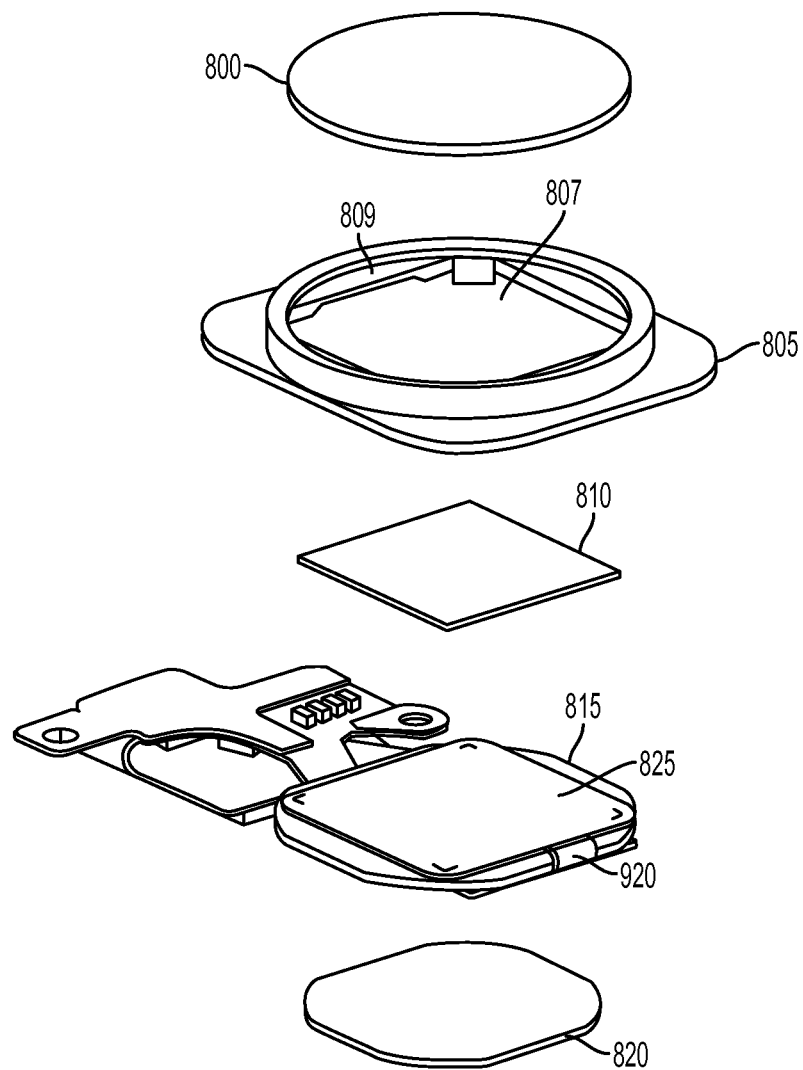
FIG. 8 depicts an exploded view of a sample biometric sensor stack.
Figure 9:
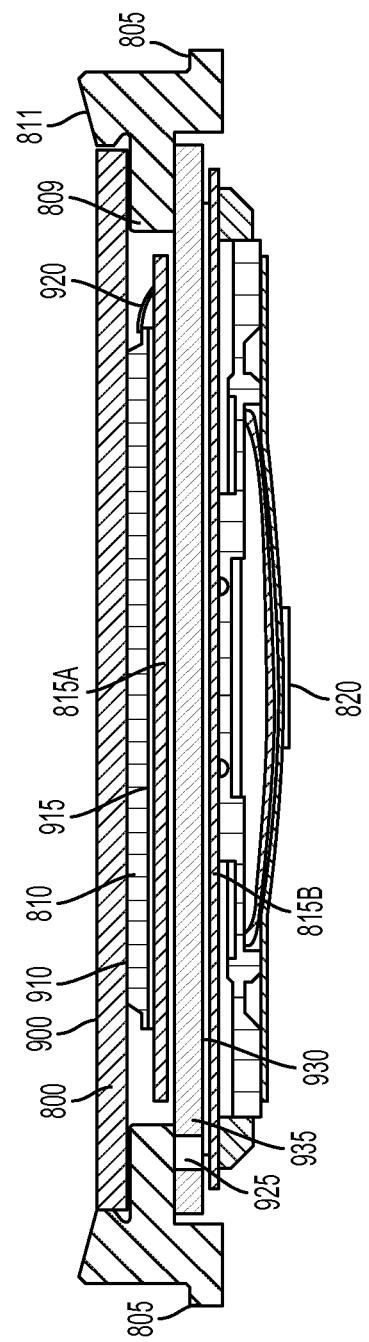
FIG. 9 depicts a cross-sectional view of the sensor stack of FIG. 8 in an assembled configuration.

FIG. 8 is an exploded view of another embodiment of a biometric sensor stack, while FIG. 9 is a cross-sectional view of the biometric sensor stack in an assembled state. In the embodiment shown in these figures, a cap 800 may be fitted into a trim 805 and may be externally accessible to a user. For example, the cap may be positioned such that a user may touch the cap during operation of the electronic device or while using the device. The user may touch the cap to permit the device to capture a fingerprint, or to depress the cap to provide an input signal to the electronic device.

The cap may be made of any suitable material. In some embodiments the cap may be made of sapphire, while in other embodiments the cap may be made from glass (either chemically-strengthened or otherwise), plastic, and the like. The cap may be laser-cut to precisely control its dimensions and tolerances, thereby permitting it to snugly fit within an opening defined in the trim 805, such as the circular opening shown in FIG. 8. An oleophobic coating 900 may be placed on an outer surface of the cap 800, although this is not required.

Generally and as described elsewhere herein, the sensor 810 (which may be a capacitive sensor having a capacitive sensing array) operates to sense biometric data, such as a fingerprint, through the cap 800. As shown to best effect in FIG. 9, the sensor 810 may be positioned directly or near-directly beneath the cap 800, thereby reducing the distance between the sensor and an object being sensed, such as a finger touching the upper surface of the cap 800. The thickness of the cap may vary between embodiments and may vary with the material used to form the cap, but generally is chosen to permit operation of the sensor. That is, if the cap 800 is too thick, the sensor 810 may not operate properly; it may generate either a blurred image or no image at all.

In order to permit suitable operation of the sensor 810, the thickness and material of the cap 810 may be controlled. For example, the cap may be formed from sapphire and have a thickness of up to 350 microns. In one embodiment, the thickness of the cap may be approximately 285 microns to permit suitable operation of the sensor 810 therethrough, for example when the sensor is a capacitive array sensor operable to capture portions of a fingerprint. The thickness of the cap may likewise depends on external factors such as the thickness of the adhesive or other material bonding the sensor to the cap, presuming such material is present. As the adhesive thickness decreases, for example, the cap thickness may increase.

Further, in some embodiments electrical traces may be patterned directly on the under-surface of the cap. This may be feasible, for example, when the cap is formed from sapphire. By patterning traces on the cap to form the sensor 810, any gap between the sensor and cap may be eliminated as may the need for an adhesive or other bonding agent.

In some embodiments, a bottom surface of the cap (e.g., the side placed within the trim) may have an ink deposited thereon to color the cap. The ink may be deposited through physical vapor deposition, screen printing, spraying, or any other suitable method of ink deposition. In other embodiments, the ink may be omitted or may be applied to the upper surface of the cap. A sealing layer may be placed on the ink, particularly in embodiments where the ink is positioned on top of the cap 800.

As shown to best effect in FIG. 9, the cap 800 may be affixed to the trim 805 by an adhesive 905. The adhesive may be an optically clear adhesive in certain embodiments, although this is not required. The adhesive may be electrically nonconductive in some embodiments, and may provide an environmental seal to prevent dust, dirt and other particles from entering the aperture 807.

The trim 805 may define an aperture 807 for receiving the cap 800. The aperture may vary in depth between embodiments. Thus, in some embodiments the cap 800 may sit flush with the edge of the ring defining the aperture 807, while in other embodiments the cap 800 may be raised or recessed with respect to the trim ring 811. In addition, it should be appreciated that the trim ring of the present embodiment equates to the ground ring 114 shown in FIG. 1 and discussed above, and therefore may be modulated (as previously described) to permit or facilitate detection of a finger and/or capture of a fingerprint by a sensor 810.

One or more ledges 809 may extend partially into the aperture 807 from the trim ring 811 and may define a resting surface on which the cap 800 sits when it is positioned in the aperture 807 (and thus in the trim 805). The ledges may support the cap while providing space for the sensor 810 to be bonded to the cap, as shown in more detail in FIG. 9 and discussed in more detail below. The ledges 809 are shown as having a planar inner surface in FIG. 8, but it should be appreciated that the inner surface may have any shape desired.

The sensor 810 may be positioned within the aperture 807 defined by the ledges 809 of the trim 805. Generally, and as shown in cross-section in FIG. 9, the sensor is sized to fit entirely within the aperture in order to conserve space in the Z-axis (e.g., upward in the orientation of both FIGS. 8 and 9). Further, the thickness of the sensor is generally less than the thickness of the ledges 809 and thus of the trim 805.

The sensor 810 may be adhered to a button flex 815A, which is one segment of a flex assembly 815. The flex assembly 815 may route signals from the sensor to another component of the electronic device, such as a processor (not shown). The operation, assembly and structure of the flex assembly are generally described in U.S. patent application 61/875,573, filed on Sep. 9, 2013, and titled "Assembly and Packaging Features of a Sensor in a Portable Electronic Device", and U.S. patent application Ser. No. 14/480,276, filed on Sep. 8, 2014, and titled "Tactile Switch Assembly in an Electronic Device," both of which are incorporated herein as if set forth fully in this document.

As shown in FIG. 8, the flex assembly 815 includes a contact pad 825 that makes contact with the sensor 810 when the biometric sensor stack is fully assembled. The contact pad may facilitate electrical connection between the sensor 810 and the flex assembly 815, and may include a wirebond 920 that carries electrical signals from the sensor 810 to the button flex substructure 815A. In some embodiments, the contact pad 825 may be at least somewhat rigid and may provide some structural support for the sensor 810.

FIG. 9 shows a stiffening plate 935 that is attached to the underside of the trim 805 (e.g., to the flanges 807). The stiffener may provide mechanical support to the sensor when a user presses the button downward by exerting force on the cap 800. In some embodiments a small gap may be present between the button flex portion 815A, to which the sensor 810 is attached, and the stiffening plate 935. The gap may permit some flexure by the sensor and/or button flex, but may prevent deformation of both or either past a certain point. That is, the button flex may contact the stiffening plate 935 during a downward deflection of the stack-up, for example as may be caused when a user depresses the cap 800. The stiffening plate may thus support either or both of the flex and the sensor 810 during a button press operation.

The stiffening plate 935 may be bonded or otherwise connected to the trim 805. In one embodiment, the trim 805 and stiffening plate 935 may be connected by a laser weld 925. The laser weld 925 may connect the stiffener to a ledge 809, for example. The number and positioning of the laser welds 925 (or other connection/bonding structure) may vary between embodiments. In some embodiments, the stiffening plate 935 may be connected to each of the ledges 809, while in other embodiments fewer than all ledges may be so connected.

In some embodiments, the sensor 810 may be electrically connected to the button flex 815A through a wirebond 920. The wirebond may be physically connected to a contact pad or other electrical connection on the button flex 815A and to an edge of the sensor 810. In some embodiments, an edge trench may be formed on the sensor 810 to facilitate attaching and/or running the wirebond 920. The wirebond 920 may, for example, transmit electrical signals from the sensor 810 to the button flex 815A.

The bottom of the stiffening plate 935 may be affixed to a second portion of the button flex 815B (the "base flex segment"). The flex circuit 815 generally wraps around and may underlie itself. Accordingly, both segments 815A and 815 are part of the same, contiguous flex element. The base flex segment 815B may be adhered to the stiffening plate 935 by any suitable adhesive 930.

Attached to an opposite side of the base flex segment 815B is a tactile switch 820. The tactile switch 820 dome may collapse under sufficient force exerted on the cap 800, as described in more detail below. Collapse of the dome switch 820 may generate an electrical signal that may act as an input to an electronic device in which the biometric sensor stack-up is housed. In some embodiments, the switch 820 may collapse under approximately 200 grams of force.

It should be noted that certain embodiments may route a signal produced by the dome switch 820 through the button flex 815, thereby causing the flex 815 to carry electrical signals from both the switch 820 and the sensor 810. In this fashion, the flex may coordinate routing of multiple different electrical signals, potentially saving space within the electronic device that would otherwise be devoted to a separate signal path for either the sensor 810 or switch 820.

Figure 10:
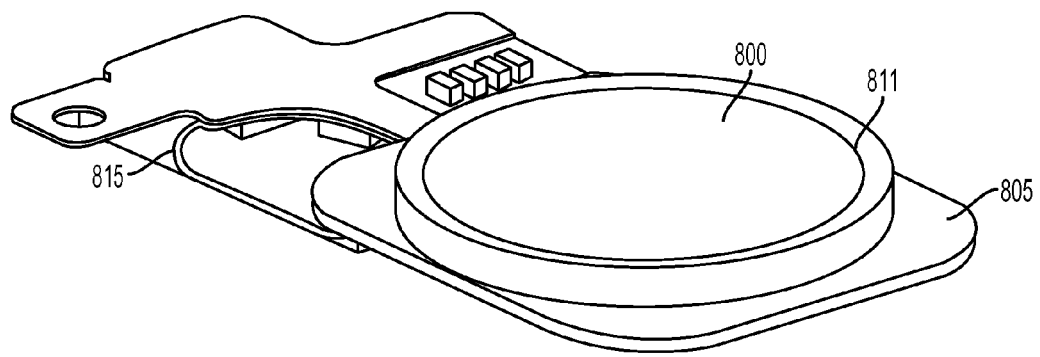
FIG. 10 is a perspective view of the sensor stack of FIG. 8 in an assembled configuration.
Figure 11:
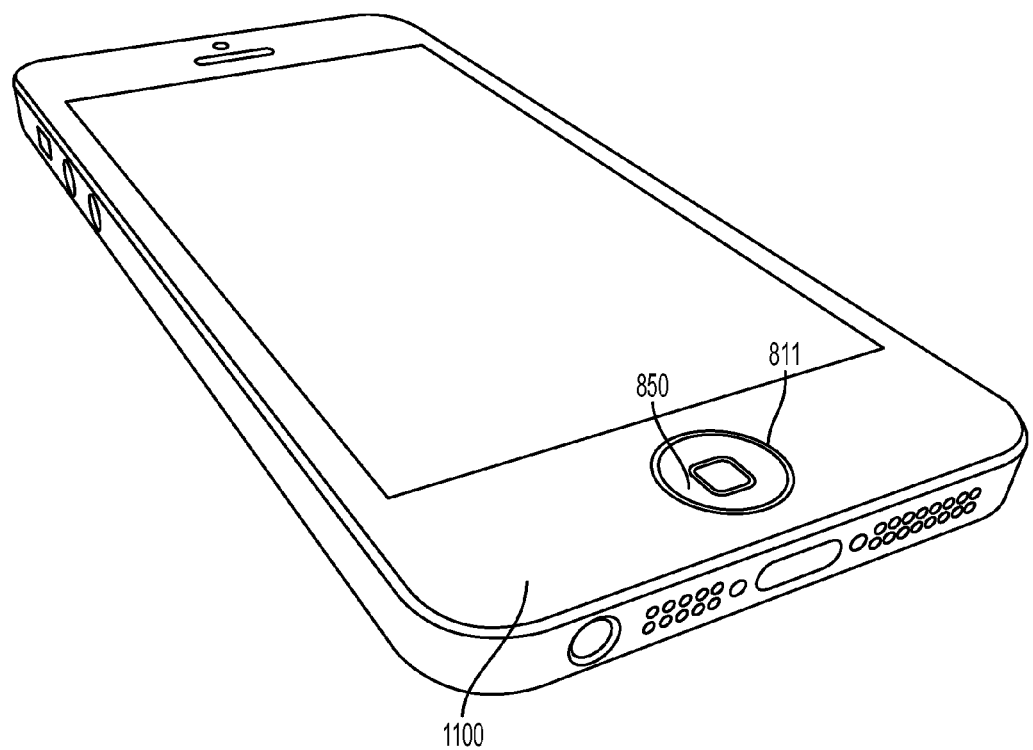
FIG. 11 shows a sample electronic device incorporating a sample biometric sensor stack.

FIG. 10 generally shows the biometric sensor stack in an assembled configuration, with the cap 800 fitted inside the trim 805. Generally, the flex 815 is not visible when the biometric sensor stack is placed within the product, as shown in FIG. 11. FIG. 11 shows the cap 800 and trim 805 flush with the cover glass 1100 extending across the surface of the electronic device.

The cover glass may be the same material used to form the cap 800, or it may be different. Thus, in some embodiments the trim/ground ring 805 may be a metal or other conductive material separating two elements formed of the same material. In other embodiments, the cap 800 and cover glass 1100 may be formed from different materials.

Figure 12:
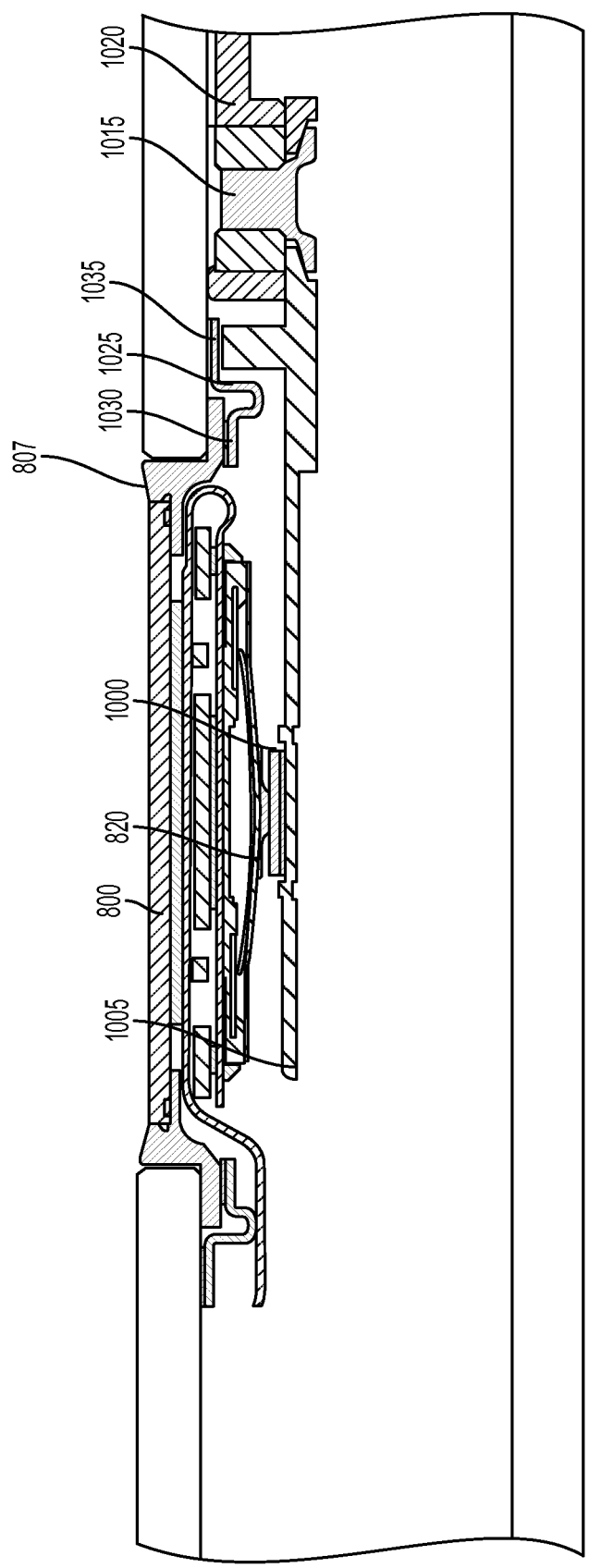
FIG. 12 is a cross-sectional view of the sample electronic device of FIG. 11 taken through the middle of the cap, showing the biometric sensor stack within the device.
Figure 13:
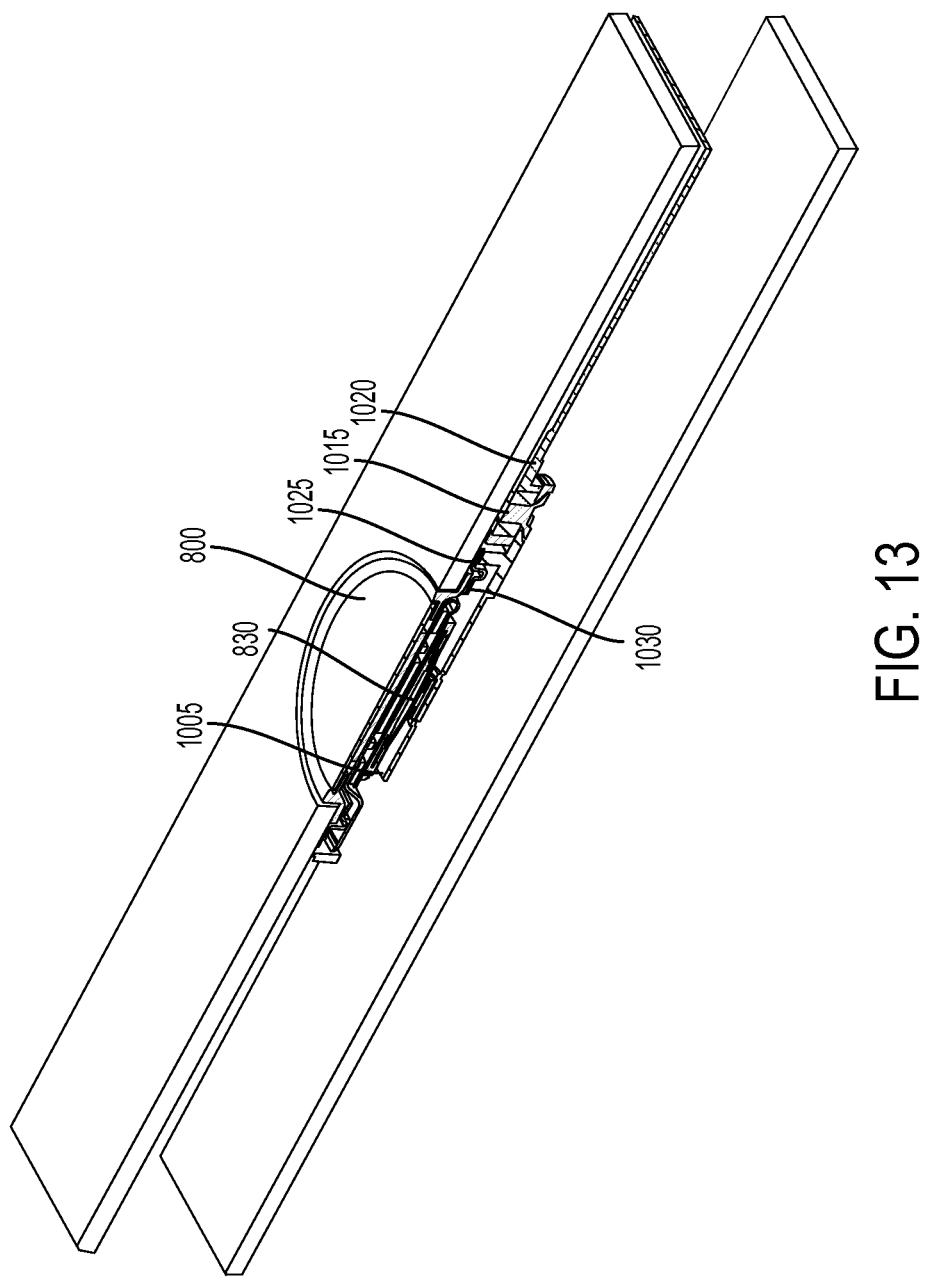
FIG. 13 is a perspective cross-sectional view similar to that of FIG. 12.
Figure 14:
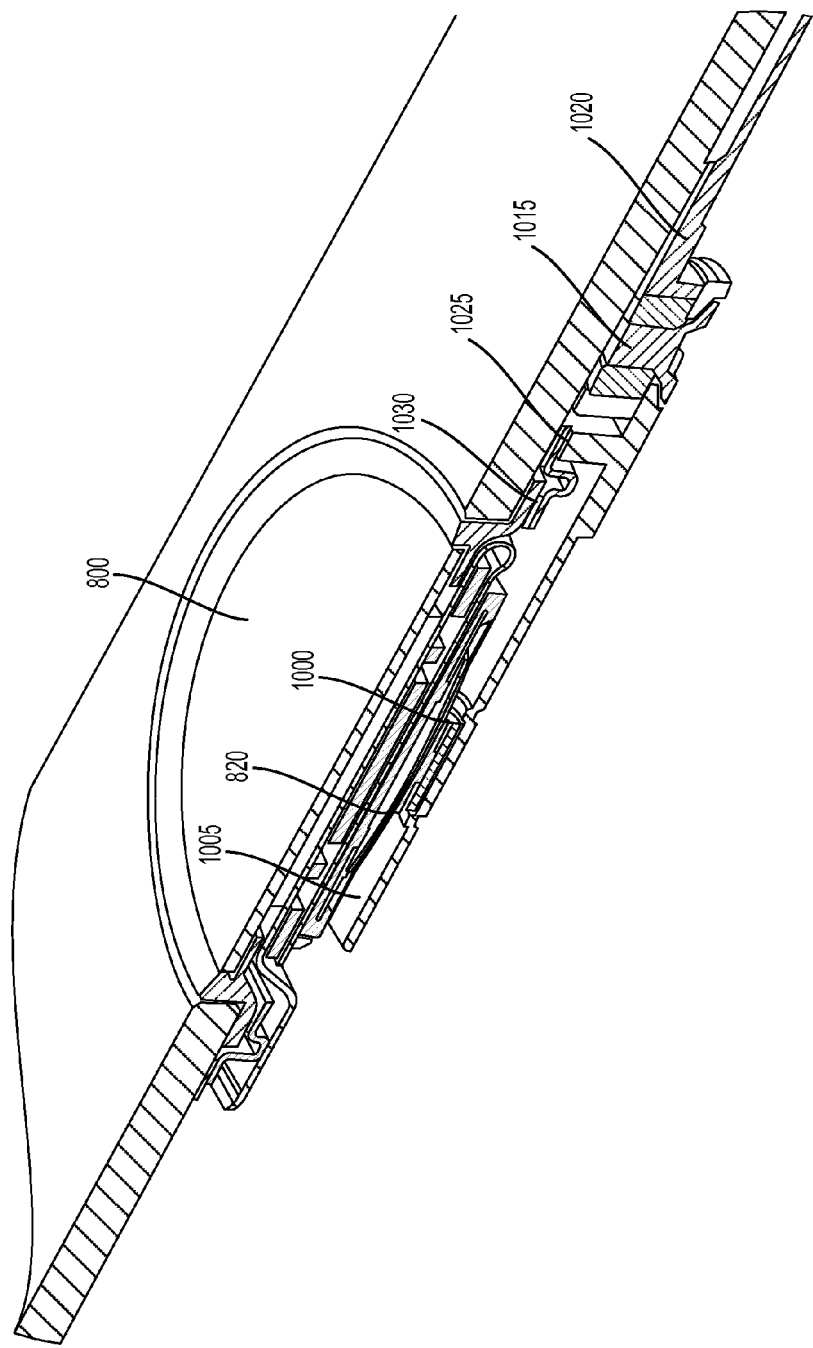
FIG. 14 is a close-up perspective cross-sectional view similar to that of FIG. 13, showing the biometric sensor stack.

FIGS. 12 and 13 are cross-sectional views taken through the biometric sensor stack and surrounding portion of the electronic device of FIG. 11, and show the biometric sensor stack of FIGS. 8-10 within the device. Generally, both figures illustrate the stack within the structure of the electronic device. FIG. 14 is a close-up perspective cross-section of the biometric sensor stack with respect to a housing of the electronic device. Various electronic and/or mechanical components may occupy space around the biometric sensor stack and components described herein. The majority of the interior of the device is shown as empty for purposes of simplicity, but it should be appreciated that, in many sample devices, other components occupy that space.

As shown to best effect in FIG. 12, a support plate or support structure 1005, which may be a metal bracket or plate, underlies the biometric sensor stack and particularly the tactile switch. A shim 1000 may be positioned between the support structure 1005 and the tactile switch in order to ensure the tactile switch is properly positioned and no excess space exists between the support structure and switch. This may enhance the feel of the button when it is pressed by a user. An adhesive 1010 may bond the shim 1000 to the support structure.

The support structure 1005 may be affixed to a frame, housing or other structural portion (such as a bracket 1020) of the electronic device by a screw 1015 or other suitable fastener. In some embodiments, adhesive may be used instead of a fastener.

A gasket 1025, such as a silicone gasket, may form a seal between the trim 805 and a housing of the electronic device. The gasket 1025 may be flexible to permit deformation during a button press and related motion of the biometric sensor stack, while returning to its original configuration when the button/cap is released. The gasket may prevent dirt, sweat, water and the like from entering the interior of the electronic device. In certain embodiments, the gasket 1025 may be affixed to the trim ring 805 and/or the housing of the device by adhesives 1030, 1035, mechanical fasteners, ultrasonic welding, and so on.

A variety of electronic components and electrical circuitry may be positioned beneath the support structure 1005 and within the cavity of the enclosure. For example, a dock connector for a data/power cable may be positioned therein. Likewise, various processor, memory elements, batteries, sensors, and the like may be placed within the cavity. The exact function, configuration and operation of such circuitry and components is not set forth further herein, as all may change from embodiment to embodiment.

During operation a user may press downward on the cap to collapse the tactile switch, thereby signaling an input to the electronic device. When the cap is pressed, the entire biometric sensor stack from the cap downward moves. The tactile switch collapses against the shim and/or support structure; this collapse generates an electrical signal that corresponds to the user's button press.

Accordingly, the cap, sensor and trim all move downward. In some embodiments the sensor and button flex may not contact the stiffening plate during travel of the sensor stack, as the stiffening plate is connected to the trim, which in turn is connected to the cap to form a relatively rigid structure. Since the sensor is within this structure and the structure as a whole moves when force is exerted on the cap, there may be no (or very little relative deflection of the sensor and/or button flex relative to the stiffening plate. Thus, the stiffening plate may serve to provide stiffness and structural integrity to the biometric sensor stack as a whole.

Insofar as the sensor may operate at any time and especially when a user is in contact with the cap, it is possible to capture biometric data (such as fingerprint information) by the sensor while a user is pressing the button (e.g., pressing on the cap). Accordingly, the biometric sensor stack may perform two functions simultaneously or substantially simultaneously: capturing biometric data and proving another input, such as a signal from the tactile switch, to the electronic device.

Figure 15:
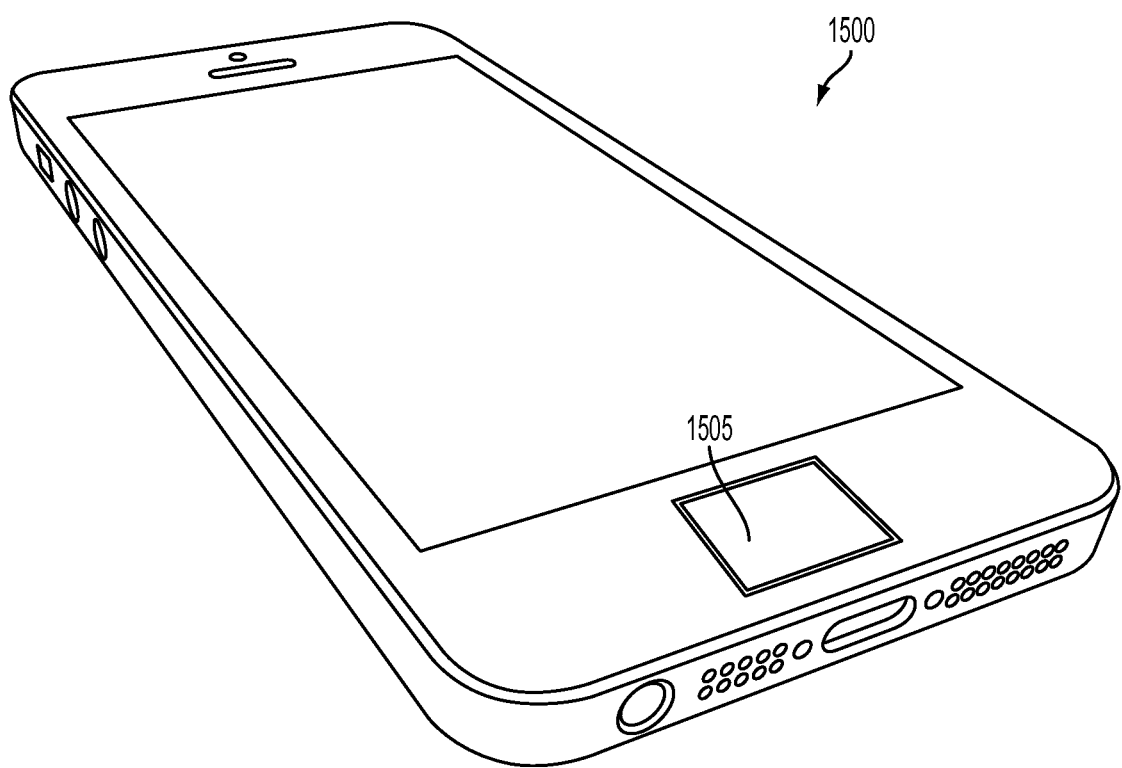
FIG. 15 shows a sample electronic device incorporating a sample biometric sensor stack having a rectangular shape.

FIG. 15 depicts a sample electronic device 1500, such as a mobile phone, having an alternately-shaped biometric sensor stack 1505. Here, the biometric sensor stack 1505 has a rectangular cap and trim. In alternative embodiments the cap and trim may be square or a rhomboid or a parallelogram, and so on.

Figure 16:
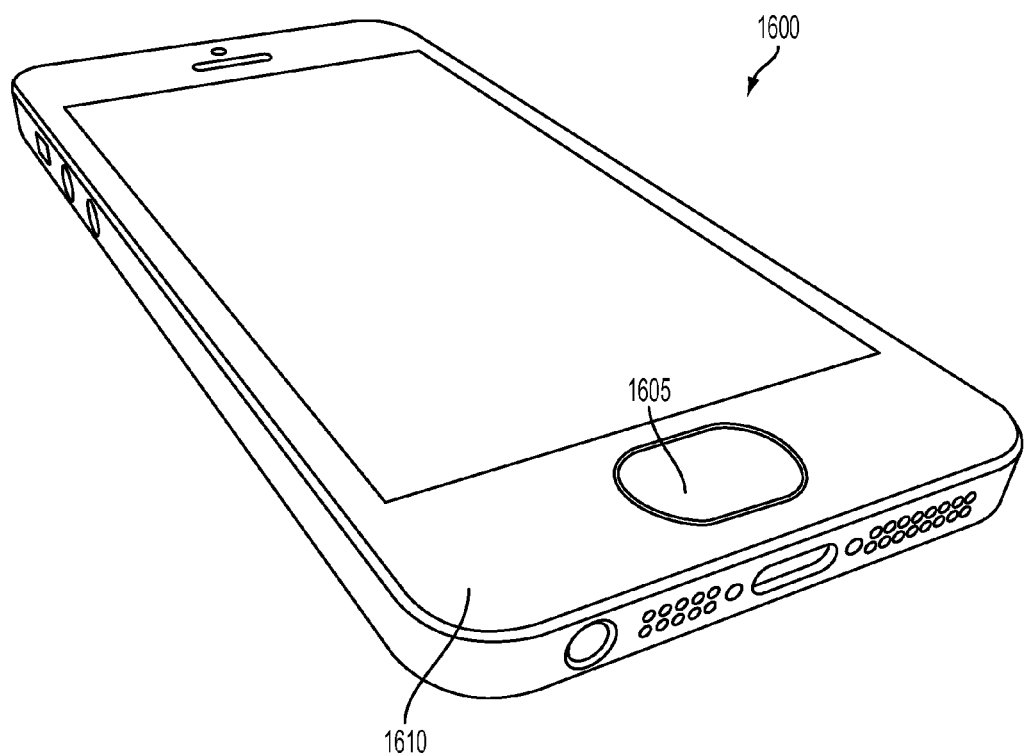
FIG. 16 shows a sample electronic device incorporating a sample biometric sensor stack having a lozenge shape.

As an example of another alternative embodiment, FIG. 16 depicts an electronic device 1600 having a biometric sensor stack 1605 with a lozenge-shaped cap and trim. The size of the cap, trim and biometric sensor stack shown in any of the figures herein may vary with respect to the size of the electronic device, the masked (e.g., non-display) region 1610 of the device, and so on.

A lozenge-shaped or rectangular-shaped button may be sufficiently long to accept multiple fingers simultaneously touching the cap. Thus, embodiments having sufficiently large or properly shaped buttons/caps may receive biometric data from multiple fingers simultaneously. In such embodiments, the sensor may receive biometric data and/or images in a particular order (for example, left to right, top to bottom and so on). This biometric data may be received as a series of blocks, lines, or other data configurations. Generally, although not necessarily, the embodiment may accept biometric data in a prescribed order while looking for a data set that lacks any biometric data or variance in capacitively-sensed data. For example, the captured data may be uniform, thus indicating no finger is above that portion of the sensor. The captured image may appear all black, all white, all gray, and the like when the captured capacitive data is transformed into an image.

A series of such blocks may indicate a space between fingers, and thus may be used to separate sets of biometric data from one another in order to recognize (or capture) data from both fingers simultaneously or near-simultaneously. This may permit specialized operations of the electronic device that are not possible when only a single fingerprint is recognized, such as multi-finger input and/or multi-finger gestural input. It should be appreciated that more than two fingers may be recognized or data may be obtained from more than two fingers, depending on the size and shape of the biometric sensor and/or cap.

Figure 17:
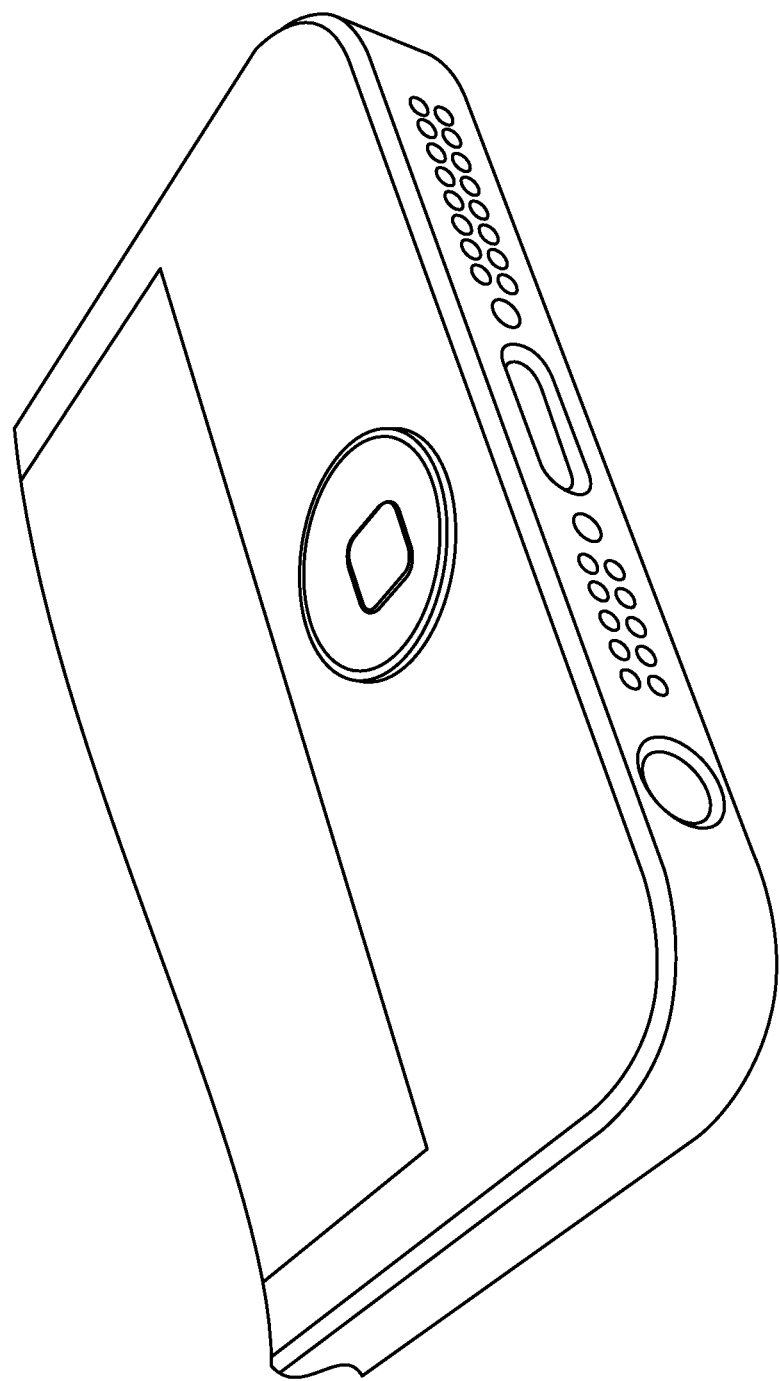
FIG. 17 shows a sample electronic device incorporating a sample biometric sensor stack having a circular shape and raised above the surface of the device.
Figure 18:
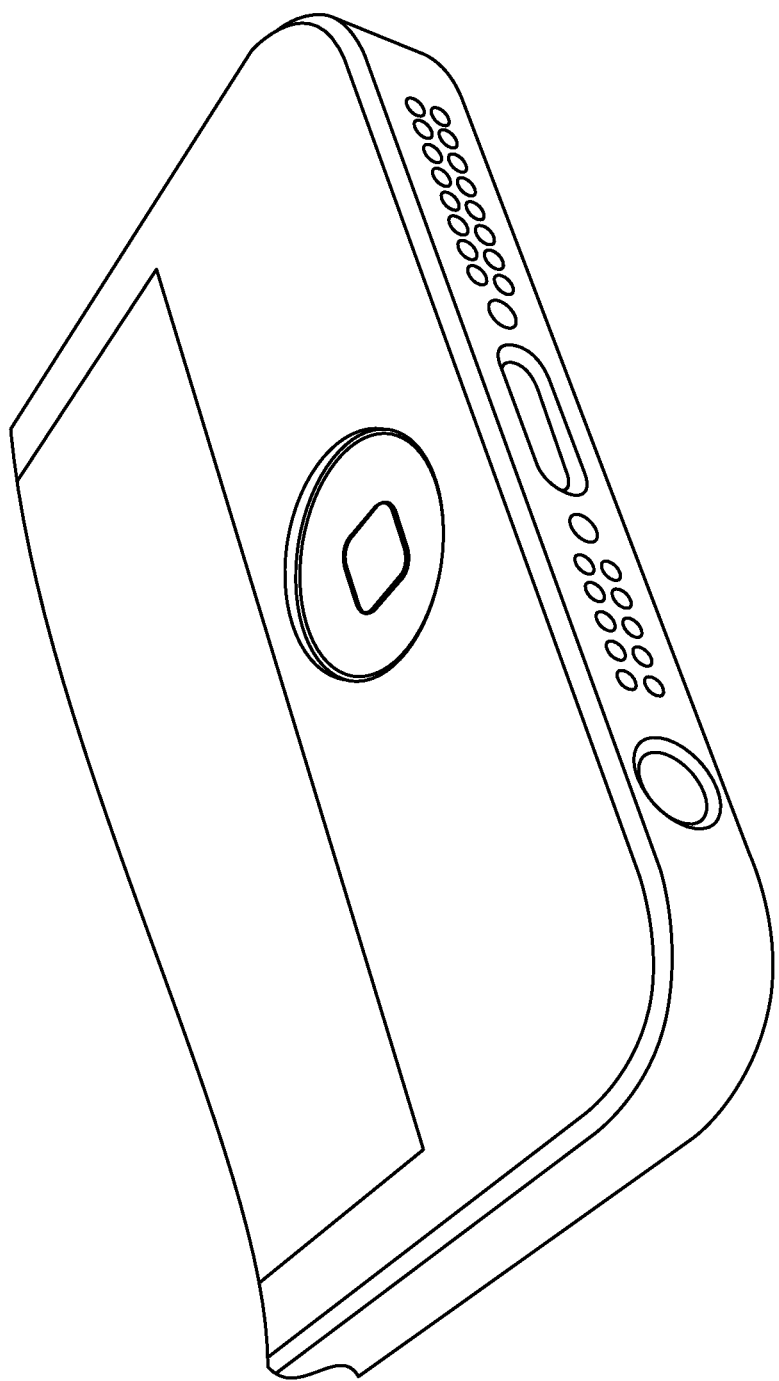
FIG. 18 shows a sample electronic device incorporating a sample biometric sensor stack having a circular shape and recessed below a surface of the device.

In addition to varying the shape of the cap and/or trim and/or biometric stack, the relative position of the cap and trim with respect to the cover glass may vary. For example and as shown in FIG. 17, the cap and ground ring may be raised above the surface of the cover glass. Conversely and as shown in FIG. 18, the cap and ground ring may be recessed with respect to the cover glass.

In some embodiments, the ground ring may be colored through physical vapor deposition (PVD). This may permit the ground ring to have different looks and possibly feel. The addition of color may enhance visibility of the ground ring and/or trim, in certain embodiments. In addition, because the ground ring capacitively couples to a user's digit, the ground ring may be overlaid with a substrate such as the cap material or the material overlaying the upper surface of the embodiment (e.g., the cover glass or other such material). Thus, in some embodiments the ground ring may not be exposed.

Likewise, the biometric sensor may be positioned elsewhere in the embodiment rather than beneath an input element such as a button. For example, the biometric sensor may be positioned in a forehead or chin area of an electronic device (e.g., above or below a display region), adjacent a sidewall, beneath the bottom of the enclosure and so on. The sensor may operate through a metal enclosure, such as aluminum, a carbon fiber enclosure, a plastic enclosure and so on. Thus, not only may the sensor be positioned as described herein, but the cap may be formed from any of these materials as well and the sensor positioned beneath.

Although the sensor has been generally described as a capacitive array sensor, it should be appreciated that different types of sensors may be used in any embodiment described herein. For example, a swipe sensor may be used rather than an array sensor. Likewise, a resistive, optical, pyro-electric or other type of biometric sensor may be used. In some embodiments, data may be captured through the cap from multiple fingers with a different type of sensor than described. For example, a lozenge-shaped cap may have a swipe sensor underlying it instead of an array sensor, and may capture data from multiple fingers that are swiped across the lozenge.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular embodiments. Functionality may be separated or combined in procedures differently in various embodiments of the disclosure or described with different terminology. These and other variations, modifications, additions, and improvements may fall within the scope of the disclosure as defined in the claims that follow.

I claim:

1. An electronic device, comprising:
   a trim defining an aperture;
   a cap disposed in the aperture;
   a rigid biometric sensor coupled to a bottom surface of the cap;
   a stiffening plate coupled to the trim below the cap, wherein a space is defined between the rigid biometric sensor and the stiffening plate; and
   a switch positioned below the stiffening plate; wherein:
   at least the cap, the stiffening plate, and the sensor are configured to move downward when a force is exerted on an outer surface of the cap.

2. The electronic device as in claim 1, wherein the cap, the biometric sensor, and the trim are configured to move downward when the force is exerted on the outer surface of the cap.

3. The electronic device as in claim 1, wherein the biometric sensor is stacked vertically below the cap and the switch is stacked vertically below the biometric sensor.

4. The electronic device as in claim 1, further comprising a cover glass extending across a surface of the electronic device.

5. The electronic device as in claim 4, wherein the cap is positioned in a button hole in the cover glass and the cap is raised above an outer surface of the cover glass.

6. The electronic device as in claim 5, wherein the trim surrounding the cap is positioned in the button hole and is raised above the outer surface of the cover glass.

7. The electronic device as in claim 4, wherein the cap is positioned in a button hole in the cover glass and the cap is recessed below an outer surface of the cover glass.

8. The electronic device as in claim 7, wherein the trim surrounding the cap is configured as a chamfer between the trim and an outer surface of the cap.

9. The electronic device as in claim 1, wherein the trim electrically isolates the biometric sensor.

10. A method for operating a biometric sensor stack in an electronic device, wherein the biometric sensor stack comprises a structure surrounding a cap, a rigid biometric sensor positioned below the cap, a stiffening plate below the cap and set apart from at least the rigid biometric sensor by a space, and a switch positioned below the biometric sensor, the method comprising:
   capturing biometric data using the biometric sensor when an external object is grounded by at least a portion of the structure surrounding the cap; and
   signaling an input to the electronic device by activating the switch based on a downward movement of at least the cap, the stiffening plate, and the biometric sensor when a force is exerted on the cap.

11. The method as in claim 10, further comprising capturing biometric data immediately before the biometric sensor begins moving.

12. The method as in claim 10, further comprising capturing biometric data immediately after the biometric sensor stops moving.

13. The method as in claim 10, wherein the biometric sensor comprises a fingerprint sensor.

14. The method as in claim 10, wherein capturing biometric data comprises capturing biometric data from one or more fingers when the biometric sensor stack is moving.

15. The method as in claim 10, wherein signaling an input to the electronic device by activating the switch based on a downward movement of the biometric sensor stack comprises signaling an input to the electronic device by collapsing the switch based on the downward movement of the biometric sensor stack.

16. The method of claim 10, wherein the rigid biometric sensor is not compressed between the cap and the stiffening plate when the force is exerted on the cap.

* * * * *